(12) United States Patent
Tsuji

(10) Patent No.: US 8,350,245 B2
(45) Date of Patent: Jan. 8, 2013

(54) VARIABLE RESISTANCE ELEMENT AND NONVOLATILE SEMICONDUCTOR MEMORY DEVICE USING THE SAME

(75) Inventor: Kiyotaka Tsuji, Osaka (JP)

(73) Assignee: Panasonic Corporation, Osaka (JP)

( * ) Notice: Subject to any disclaimer, the term of this patent is extended or adjusted under 35 U.S.C. 154(b) by 90 days.

(21) Appl. No.: 13/133,809

(22) PCT Filed: Dec. 8, 2009

(86) PCT No.: PCT/JP2009/006698
§ 371 (c)(1),
(2), (4) Date: Jun. 9, 2011

(87) PCT Pub. No.: WO2010/067585
PCT Pub. Date: Jun. 17, 2010

(65) Prior Publication Data
US 2011/0240942 A1    Oct. 6, 2011

(30) Foreign Application Priority Data
Dec. 10, 2008 (JP) ................................. 2008-314026

(51) Int. Cl.
*H01L 29/02* (2006.01)
(52) U.S. Cl. .. 257/2; 257/3; 257/4; 257/5; 257/E29.002; 438/102; 438/103; 438/104
(58) Field of Classification Search .................. 257/2–5, 257/E29.002; 438/102–104
See application file for complete search history.

(56) References Cited

U.S. PATENT DOCUMENTS

| | | | |
|---|---|---|---|
| 6,482,657 B2 * | 11/2002 | Shimazawa | 438/3 |
| 6,939,722 B2 * | 9/2005 | Okazawa et al. | 438/3 |
| 6,972,238 B2 | 12/2005 | Hsu et al. | |
| 7,148,533 B2 | 12/2006 | Hsu et al. | |
| 7,232,703 B2 | 6/2007 | Morita et al. | |
| 7,345,908 B2 | 3/2008 | Hachino et al. | |

(Continued)

FOREIGN PATENT DOCUMENTS

JP    2004-349690    12/2004

(Continued)

OTHER PUBLICATIONS

International Search Report issued Mar. 16, 2010 in International (PCT) Application No. PCT/JP2009/006698.

*Primary Examiner* — Jami M Valentine
(74) *Attorney, Agent, or Firm* — Wenderoth, Lind & Ponack, LLP

(57) ABSTRACT

To provide a variable resistance element capable of preventing the interface resistance, in a side of the variable resistance element in which resistance change is not allowed, from changing to high resistance due to applied voltage. The variable resistance element is configured by providing a variable resistance film (265) between a first electrode (280) and a second electrode (250), the oxygen concentration within the film of the variable resistance film (265) is high at the side of an interface with the second electrode (250) (high-concentration variable resistance layer (260)) and low at the side of an interface with the first electrode (280) (low-concentration variable resistance layer (270)), and the junction surface area between the low-concentration variable resistance layer (270) and the first electrode (280) is larger than the interface surface area between the high-concentration variable resistance layer (260) and the second electrode (250).

10 Claims, 18 Drawing Sheets

U.S. PATENT DOCUMENTS

| | | |
|---|---|---|
| 7,394,090 B2 | 7/2008 | Morita et al. |
| 7,560,724 B2 | 7/2009 | Aratani et al. |
| 7,639,521 B2 | 12/2009 | Baek et al. |
| 7,781,230 B2 | 8/2010 | Odagawa et al. |
| 2004/0235200 A1 | 11/2004 | Hsu et al. |
| 2005/0093043 A1 | 5/2005 | Morita et al. |
| 2006/0011897 A1 | 1/2006 | Hsu et al. |
| 2006/0081961 A1 | 4/2006 | Tanaka et al. |
| 2006/0085833 A1* | 4/2006 | Kwon ............... 725/111 |
| 2006/0215445 A1 | 9/2006 | Baek et al. |
| 2007/0012959 A1 | 1/2007 | Hachino et al. |
| 2007/0210362 A1 | 9/2007 | Morita et al. |
| 2007/0240995 A1 | 10/2007 | Odagawa et al. |
| 2008/0048164 A1* | 2/2008 | Odagawa ............... 257/2 |
| 2008/0083918 A1 | 4/2008 | Aratani et al. |
| 2008/0157053 A1* | 7/2008 | Lai et al. ............... 257/4 |
| 2009/0224224 A1 | 9/2009 | Fujii et al. |
| 2009/0250678 A1 | 10/2009 | Osano et al. |
| 2009/0283736 A1 | 11/2009 | Kanzawa et al. |
| 2009/0309690 A1 | 12/2009 | Kinoshita et al. |
| 2009/0321709 A1 | 12/2009 | Muraoka et al. |
| 2010/0044666 A1 | 2/2010 | Baek et al. |
| 2011/0074539 A1* | 3/2011 | Tsuji ............... 338/20 |

FOREIGN PATENT DOCUMENTS

| | | |
|---|---|---|
| JP | 2006-40946 | 2/2006 |
| JP | 2006-120701 | 5/2006 |
| JP | 2006-120707 | 5/2006 |
| JP | 2006-279042 | 10/2006 |
| JP | 2007-26492 | 2/2007 |
| JP | 2007-287761 | 11/2007 |
| JP | 2007-294745 | 11/2007 |
| JP | 2008-21750 | 1/2008 |
| JP | 2008-28248 | 2/2008 |
| JP | 2008-251108 | 10/2008 |
| WO | 2004/100266 | 11/2004 |
| WO | 2008/023637 | 2/2008 |
| WO | 2008/059701 | 5/2008 |
| WO | 2008/107941 | 9/2008 |
| WO | 2008/126365 | 10/2008 |
| WO | 2008/149484 | 12/2008 |

* cited by examiner

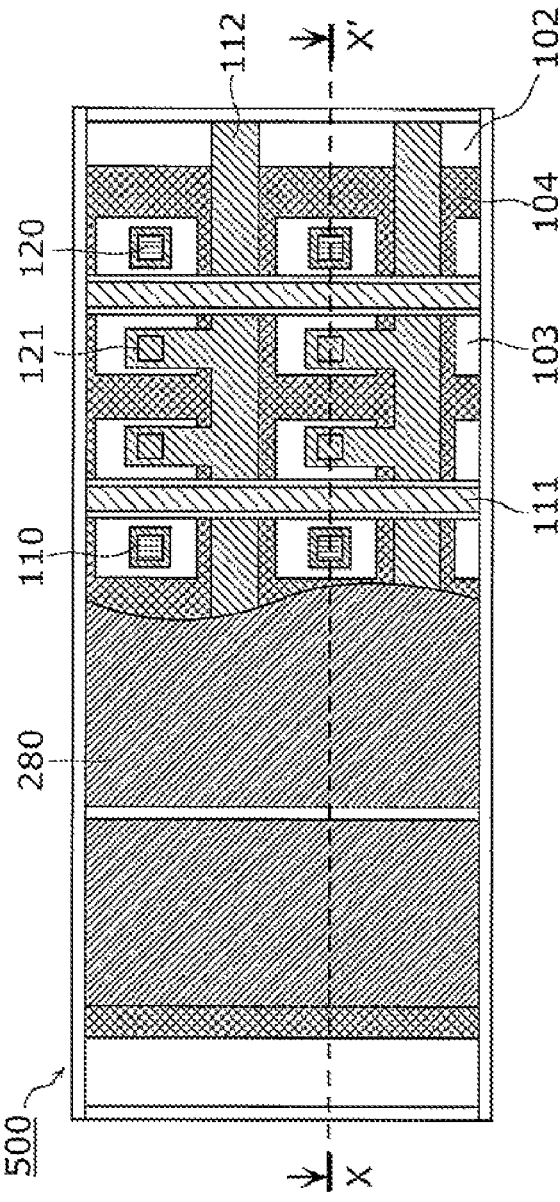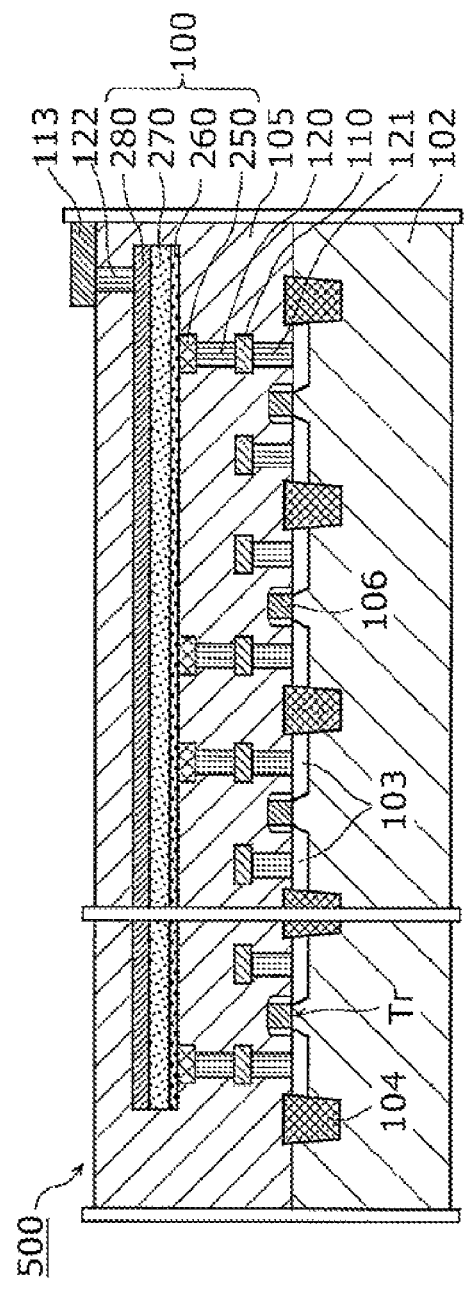
FIG. 7A
FIG. 7B

VARIABLE RESISTANCE ELEMENT AND NONVOLATILE SEMICONDUCTOR MEMORY DEVICE USING THE SAME

TECHNICAL FIELD

The present invention relates to a variable resistance element having a stably held resistance value that changes according to application of a voltage pulse, and to a nonvolatile semiconductor memory device using the variable resistance element.

BACKGROUND ART

Recent years have seen increasingly higher performance in electronic devices such as portable information devices and information appliances following the development of digital technology. As such, there is an increased demand for larger capacity, reduced writing power consumption, higher speed during writing and reading, and extended operational life in nonvolatile semiconductor memory devices.

In view of these demands, there has been an advance in the miniaturization of flash memories using existing floating gates.

On the other hand, in the case of a nonvolatile semiconductor memory element (variable resistance memory) which uses, in a memory unit, a variable resistance element in which a stably held resistance value changes according to a voltage pulse, a memory cell can be configured using a simple structure, and thus further miniaturization, increase in speed, and reduction of power consumption are expected.

Conventionally, a memory cell that performs stable memory operations is configured using one transistor and one memory element, and increased integration is carried out using this memory cell.

For example, PTL 1 discloses a structure of what is called an 1T1R memory cell in which one memory cell is a combination of one transistor and one variable resistance element, and in which the variable resistance element is configured by forming a variable resistance region in part of a variable resistance layer which is formed directly below an upper electrode and uses a material having a perovskite structure. In PTL 1, the surface area of the lower electrode of the variable resistance element that is in contact with the variable resistance layer and the surface area of the upper electrode that is in contact with the variable resistance layer are different, and the variable resistance region is formed directly above the lower electrode which has a small surface area. Therefore, miniaturization and power consumption reduction can be carried out, since resistance change can be reliably obtained in the vicinity of the electrode having a small connection size, through the application of a current that is smaller than what is conventional.

Furthermore, PTL 2 discloses an example which uses, as a material of the variable resistance element, a material other than the material having the perovskite structure (see FIG. 1 and FIG. 2 of PTL 2). In PTL 2, by using a ferrioxide as a variable resistance layer, the temperature required for manufacturing the variable resistance element can be set to 400° C. or lower, and the compatibility with the semiconductor manufacturing process is improved.

CITATION LIST

Patent Literature

[PTL 1]
Japanese Unexamined Patent Application Publication No. 2006-120701
[PTL 2]
Japanese Unexamined Patent Application Publication No. 2007-287761

SUMMARY OF INVENTION

Technical Problem

The variable resistance element has a structure in which the variable resistance layer is disposed between the upper electrode and the lower electrode, and it is known that, depending on the variable resistance material, the resistance change thereof occurs through the changing of the resistance of the variable resistance layer in the vicinity of the interface between the variable resistance layer and the upper electrode or the lower electrode, according to voltages of different polarity applied between the upper electrode and the lower electrode.

In order to stably perform the resistance change of the variable resistance element, it is necessary that the interface at which the resistance change occurs be limited to one of the interfaces, and that, in the other interface, the resistance of the interface does not change from the low resistance state regardless of the application of voltage.

However, since the interface between the variable resistance layer and the upper electrode and the interface between the variable resistance layer and the lower electrode are of the same structure in the structure shown in FIG. 1 of PTL 2, causing resistance change in one interface while suppressing resistance change in the other interface is difficult. As a countermeasure, FIG. 2 in PTL 2 shows a method of forming a layer having high oxygen concentration between the variable resistance layer and the lower electrode. However, even in this case, it is difficult to keep the interface between the variable resistance layer and the upper electrode completely in the low resistance state.

In view of this, the present invention has as an object to provide a variable resistance element for which the probability for mis-writing is suppressed and a nonvolatile semiconductor memory device using the variable resistance element.

Solution to Problem

In order to achieve the aforementioned object, the variable resistance element in an aspect of the present invention includes: a substrate; and a multilayered structure formed above the substrate, wherein the multilayered structure includes a first electrode, a second electrode, and a variable resistance film that is disposed between the first and second electrodes and changes between a high resistance state and a low resistance state according to a polarity of a voltage applied between the first and second electrodes, the variable resistance film includes a low-concentration variable resistance layer (low-concentration oxide layer) which is in contact with the first electrode, and a high-concentration variable resistance layer (high-concentration oxide layer which induces resistance change) which is in contact with the second electrode, an oxygen concentration of the low-concentration variable resistance layer is lower than an oxygen concentration of the high-concentration variable resistance layer, and a junction surface area between the first electrode and the low-concentration variable resistance layer is larger than a junction surface area between the second electrode and the high-concentration variable resistance layer. Accordingly, since the junction surface area between the low-concentration variable resistance layer and the electrode that is in contact with the low-concentration variable resistance layer is larger than the junction surface area between the high-concentration variable resistance layer and the electrode that is in contact with the high-concentration variable resistance layer, it is possible to suppress the resistance change phenomenon in the low-concentration variable resistance layer which is regarded as a cause of mis-writing.

Here, the high-concentration variable resistance layer may be patterned to completely cover one plane of the second electrode, and the low-concentration variable resistance layer may cover an end plane and side planes of the high-concentration variable resistance layer, the end plane being located opposite to an end plane of the high-concentration variable resistance layer, which is connected to the second electrode. Accordingly, since the high-concentration variable resistance layer is removed except in the vicinity of the upper portion of the second electrode, oxygen diffusion to the low-concentration variable resistance layer from the removed portion is avoided, and the increase in the oxygen concentration of the low-concentration variable resistance layer is prevented by just as much. As a result, the probability for the occurrence of the change to high resistance in the interface between the low-concentration variable resistance layer and the first electrode is further suppressed.

In addition, of a plane of the high-concentration variable to resistance layer, which is in contact with the second electrode, a region that is not in contact with the second electrode may be covered by an oxygen barrier. By adopting such a configuration, it is possible to prevent changes in the oxygen concentration of the high-concentration variable resistance layer caused by oxygen from the high-concentration variable resistance layer escaping inside the interlayer insulating film or, inversely, by excessive oxygen being introduced from the high-concentration variable resistance layer, and thus the resistance change operation of the variable resistance element can be further stabilized.

Furthermore, of the second electrode, an end plane that is opposite to an end plane which is in contact with the high-concentration variable resistance layer may be connected to a line formed above or below the second electrode. More specifically, the second electrode may be a via that fills a via hole provided in an interlayer insulating film located between the high-concentration variable resistance layer and the line, the second electrode may electrically connect the high-concentration variable resistance layer and the line. Specifically, in the variable resistance element in the present invention, the via for electrically connecting either the drain or source electrode of the transistor to the lower electrode is formed using the same material as the lower electrode thereby allowing the via and the lower electrode to be integrated. With this, miniaturization and a reduction in the number of processes become possible.

It should be noted that the second electrode may comprise platinum, iridium, or a composite of platinum and iridium. Furthermore, the first electrode may comprise at least any one selected from among copper, titanium, tungsten, tantalum, and tantalum nitride. In addition, with regard to the variable resistance film, the high-concentration variable resistance layer and the low-concentration variable resistance layer may be oxygen-deficient metal oxides which are oxides having a lower oxygen content compared to an oxide having a stoichiometric composition, the oxygen content being an atom number ratio, and the metal oxide films may comprise at least any one selected from among tantalum oxide, ferrioxide, titanium oxide, vanadium oxide, cobalt oxide, nickel oxide, zinc oxide, niobium oxide, and hafnium oxide.

In addition, it is possible to configure a 1T1R memory cell array by forming variable resistance elements on a substrate on which transistors are formed, wherein the respective lower electrodes of the variable resistance elements are electrically connected independently to the drain electrode or source electrode of the transistor through a via, the gate electrode of the transistor is connected to a word line, the electrode that is not electrically connected to the lower electrode of the variable resistance element out of the drain electrode or source electrode of the transistor is connected to a bit line that is arranged in an orthogonal direction to the word line, and the upper electrode is electrically connected to a common plate line.

In other words, a memory block may include memory cells each of which includes (i) any one of the above-described variable resistance elements and (ii) a transistor having a source or drain connected to the variable resistance element, and the first electrodes and the low-concentration variable resistance layers of variable resistance elements included in the memory block may be respectively formed in common, for the memory cells. At this time, the high-concentration variable resistance layer of each of the variable resistance elements included in the memory block may be formed in common for the memory cells included in the memory block.

By adopting a structure in which the upper electrode and the variable resistance film are respectively shared among the variable resistance elements, the ratio of the junction surface area at the lower electrode-side of the variable resistance element to the junction surface area at the upper electrode-side of the variable resistance element can be increased, and thus the advantageous effect of preventing resistance change at the upper electrode-side can be further enhanced. This leads to further stabilization of the resistance change operation of the variable resistance element.

Advantageous Effects of Invention

By adopting a structure in which the junction surface area between the upper electrode and the variable resistance film is larger than the junction surface area between the lower electrode and the variable resistance film, and the oxygen concentration at the lower electrode-side of the variable resistance film is higher than at the upper electrode-side, the variable resistance element in the present invention has the advantageous effect that although the resistance of the interface between the variable resistance film and the lower electrode changes according to the voltage applied, the resistance of the interface between the variable resistance film and the upper electrode does not change from the low resistance state. In other words, it is possible to obtain the advantageous effect of allowing suppression of mis-writing in the memory cell operation.

Therefore, the present invention realizes a variable resistance element and a nonvolatile semiconductor memory device that perform the resistance change operation more reliably, and, in these times where electronic devices such as portable information devices and information appliances have become popular, the practical value of the variable resistance element and the nonvolatile semiconductor memory device according to the present invention, which are suited to miniaturization, increased speed, and reduced power consumption, is extremely high.

BRIEF DESCRIPTION OF DRAWINGS

FIG. 7A is a top plane schematic view of a configuration of a nonvolatile semiconductor memory device configured using the variable resistance element according to Embodiment 1 of the present invention, and FIG. 7B is a schematic diagram showing a cross-section of FIG. 7A.

DESCRIPTION OF EMBODIMENTS

Figure 1:
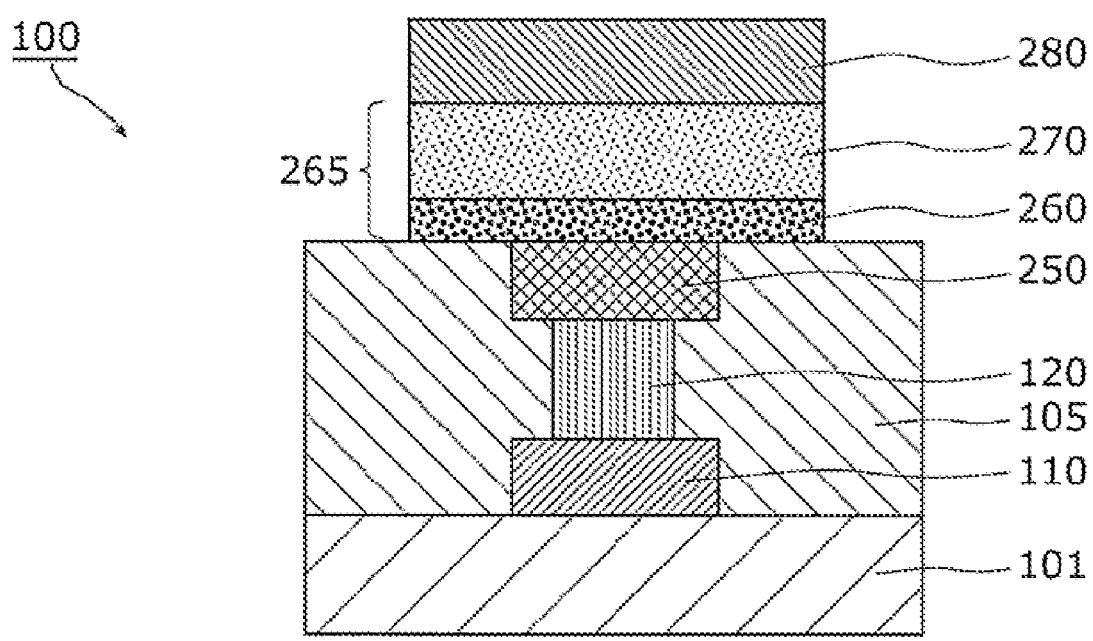
FIG. 1 is a schematic diagram showing an example of a cross-sectional configuration of a variable resistance element according to Embodiment 1 of the present invention.

Hereinafter, embodiments of the present invention shall be described with reference to the Drawings. It should be noted that the same components are assigned the same reference signs and their description shall not be repeated.

Furthermore, in the Drawings, the shapes of the memory unit, and so on, are merely schematic, and their number, and so on, are set merely for the sake of convenient illustration.

It should be noted that in the present invention, "forming . . . above the substrate" means, according to common interpretation, both forming a structural element directly on top of the substrate and forming a structural element above the substrate with another element disposed therebetween. Furthermore, "interlayer insulating film" refers to both an interlayer insulating film formed by one process in the process of manufacturing the variable resistance element and plural interlayer insulating films respectively formed by plural processes in the process of manufacturing the variable resistance element. Furthermore, "as seen from the thickness direction of the substrate" means "seen perspectively or non-perspectively from the thickness direction of the substrate".

Embodiment 1

First, a variable resistance element and a nonvolatile semiconductor memory device in Embodiment 1 of the present invention shall be described.

FIG. 1 is a cross-sectional view of an example of a cross-sectional configuration of a variable resistance element 100 according to Embodiment 1 of the present invention.

As shown in FIG. 1, the variable resistance element 100 according to the present embodiment includes: a line 110 formed above a substrate 101; an interlayer insulating film 105 formed to cover the line 110; a via 120 embedded within the interlayer insulating film 105 and electrically connected to the top plane of the line 110; a lower electrode 250 that is electrically connected to the top plane of the via 120; a variable resistance film 265 that is electrically connected to the top plane of the lower electrode 250 and formed to cover the top plane of the lower electrode 250; and an upper electrode 280 formed on the variable resistance film 265. In addition, the variable resistance film 265 has bipolar resistance change characteristics such that the variable resistance film 265 changes between a high resistance state and a low resistance state according to the polarity of a voltage applied between the upper electrode 280 and the lower electrode 250. Furthermore, the variable resistance film 265 is configured such that the oxygen concentration within the film is high at the side of the interface with the lower electrode 250 (high-concentration variable resistance layer 260) and is low at the side of the interface with the upper electrode 280 (low-concentration variable resistance layer 270). Specifically, the oxygen concentration of the low-concentration variable resistance layer 270 is lower than the oxygen concentration of the high-concentration variable resistance layer 260.

It should be noted that the upper electrode 280 is an example of the first electrode which is in contact with the low-concentration variable resistance layer 270, and the lower electrode 250 is an example of the second electrode which is in contact with the high-concentration variable resistance layer 260.

In addition, the junction surface area (the surface area formed by contacting planes) between the low-concentration variable resistance layer 270 and the upper electrode 280 is larger than the junction surface area between the high-concentration variable resistance layer 260 and the lower electrode 250. Furthermore, side planes of the high-concentration variable resistance layer 260 and side planes of the lower electrode 250 are not continuously connected.

By adopting such a configuration, resistance change occurs only in the interface between the high-concentration variable resistance layer 260 and the lower electrode 250, and thus a stable resistance change operation can be realized.

Next, a method of manufacturing the variable resistance element 100 in Embodiment 1 shall be described using FIGS. 2A and 2B to FIGS. 6A and 6B. In each of the figures, A is a schematic diagram showing a top plane, and B is a cross-sectional view of the cross-section along line X-X' in A as seen from the direction of the arrows.

Figure 2A:
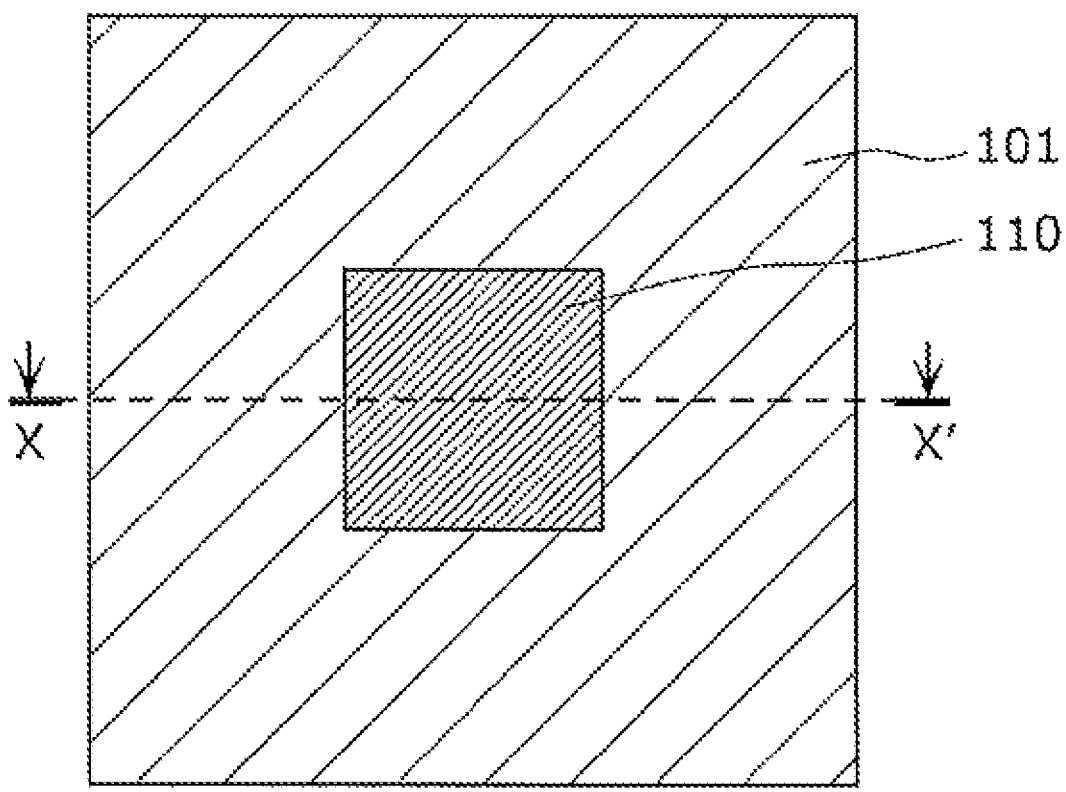
FIG. 2A is a top plane schematic view of a process of placing a line on a substrate, in a method of manufacturing the variable resistance element according to Embodiment 1 of the present invention.
Figure 2B:
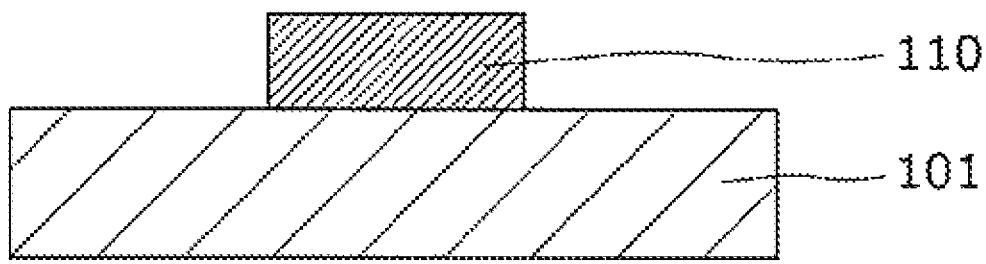
FIG. 2B is a schematic diagram showing a cross-section of FIG. 2A.

First, the line 110 is formed by depositing a line-use conductive film above the substrate 101 using a sputtering method, a CVD method, and so on, after which masking using an exposure process and etching are performed (FIGS. 2A and 2B). Although a material such as Al, Cu, an Al—Cu alloy, and a Ti—Al—N alloy can be used for the line 110, a Al film deposited by the sputtering method is used in the present embodiment.

Furthermore, the line 110 has a thickness of between 200 nm and 400 nm, inclusive, and a width of approximately 0.6 μm. The interval (gap) between adjacent lines 110 is approximately 0.8 μm.

Figure 3A:
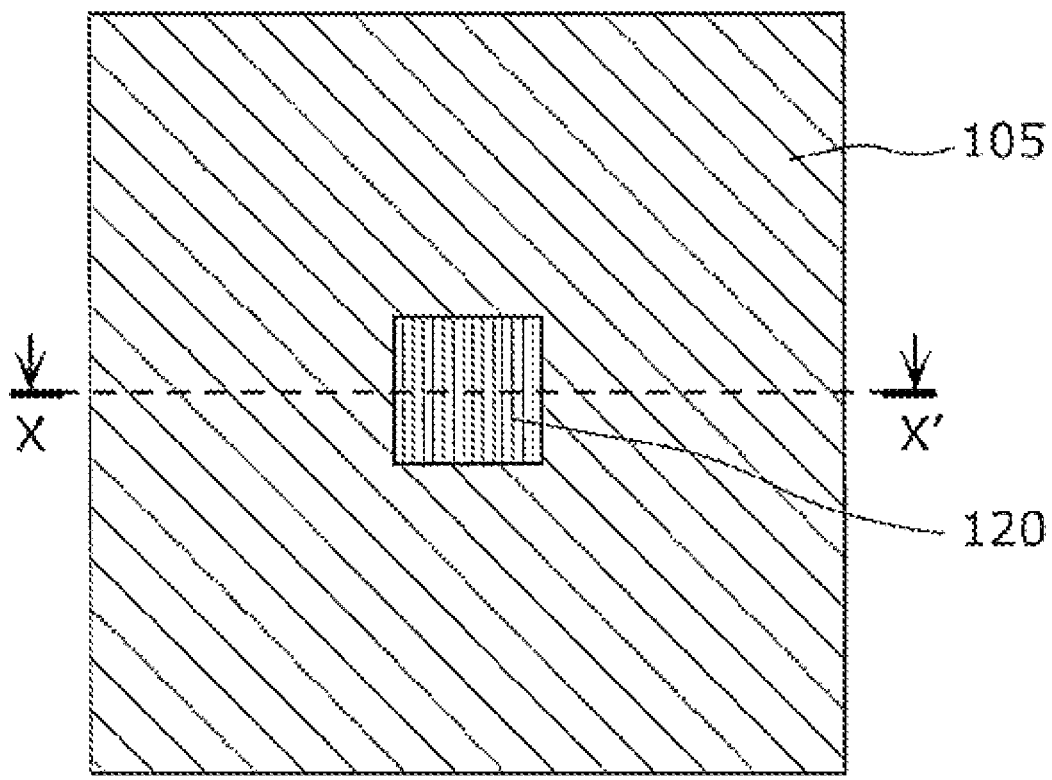
FIG. 3A is a top plane schematic view of processes up to the forming of a via, in the method of manufacturing the variable resistance element according to Embodiment 1 of the present invention.
Figure 3B:
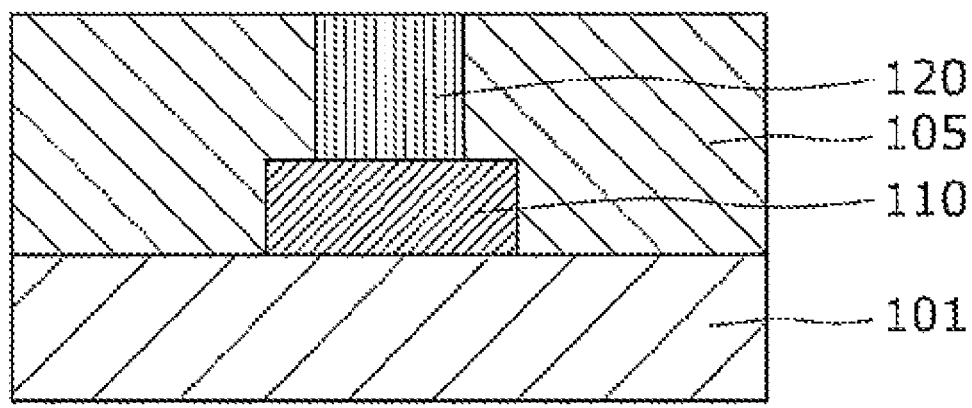
FIG. 3B is a schematic diagram showing a cross-section of FIG. 3A.

Next, as shown in FIGS. 3A and 3B, the via 120 is formed so as to be embedded within the interlayer insulating film 105. Such forming is possible in the manner described below. Specifically, the interlayer insulating film 105 comprising TEOS—SiO and having a thickness of 800 nm is deposited on the structure shown in FIGS. 2A and 2B, using for example the CVD method, and the surface thereof is made approximately flat by polishing off 400 nm by for example CMP.

It should be noted that, aside from TEOS—SiO, a silicon nitride (SiN) film, a silicon carbonitride (SiCN) film which is a low-permittivity material, a silicon oxycarbide (SiOC) film, a fluorinated silicon oxide (SiOF) film, and so on may be used for the interlayer insulating film 105. In addition, a stacked structure of these materials may be used.

Subsequently, a via hole (diameter: 260 nm) for connecting to the line 110 is formed in the interlayer insulating film 105. This can be easily formed using techniques commonly used in the semiconductor process.

The structure shown in FIGS. 3A and 3B can be formed by performing, for example, CMP after forming a conductive film which becomes the via 120 and comprises tungsten (W) using, for example, the CVD method after forming such a via hole. It should be noted that, aside from tungsten (W), copper (Cu) or aluminum (Al) may be used for the via 120.

Figure 4A:
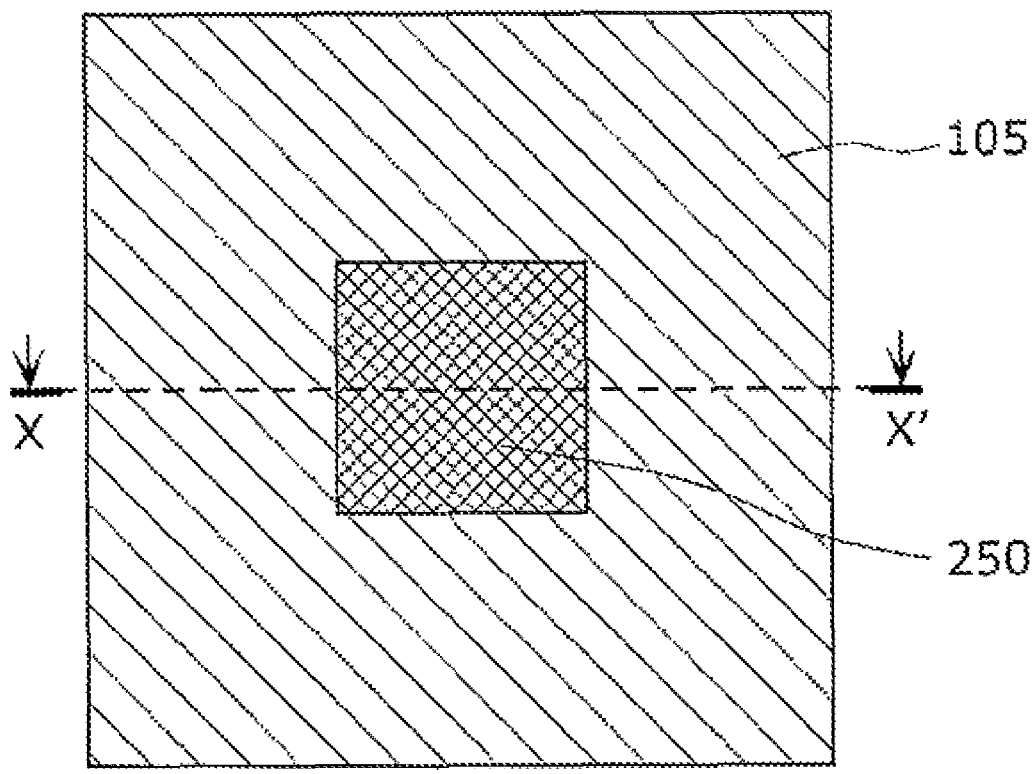
FIG. 4A is a top plane schematic view of a process of forming of a lower electrode, in the method of manufacturing the variable resistance element according to Embodiment 1 of the present invention.
Figure 4B:
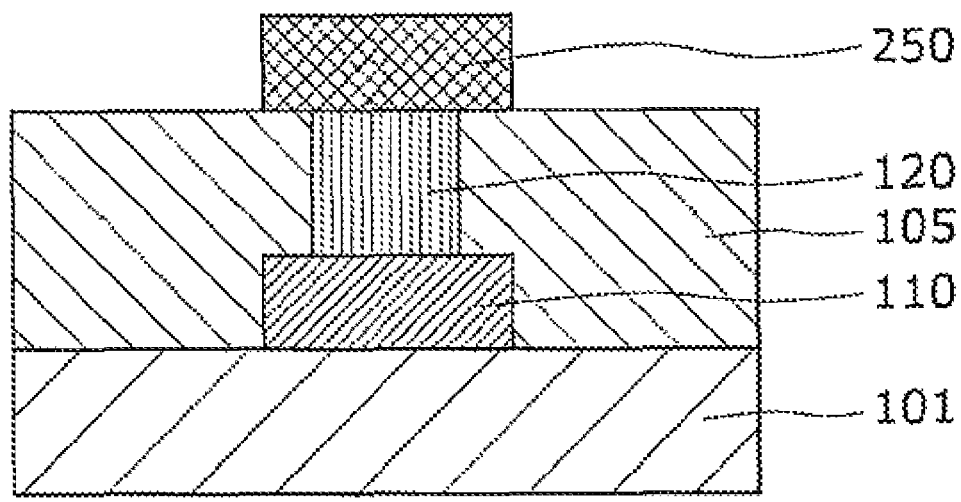
FIG. 4B is a schematic diagram showing a cross-section of FIG. 4A.

Next, as shown in FIGS. 4A and 4B, the lower electrode 250 is formed on the interlayer insulating film 105 including the via 120. Such forming is possible in the manner described below. Specifically, the lower electrode 250 of predetermined dimensions is formed by masking using the exposure process and etching after forming a metal electrode layer using the sputtering method, the CVD method, and so on.

As an electrode which sufficiently brings out the function of the high-concentration variable resistance layer 260, that is, as an electrode that facilitates resistance change, it is preferable that a noble metal material such as platinum (Pt) or iridium (Ir), or a composite of these, be used for the lower electrode 250. In the present embodiment, platinum (Pt) is used. Furthermore, the lower electrode 250 measures 0.5 μm×0.5 μm and has a thickness of 50 nm.

Figure 5A:
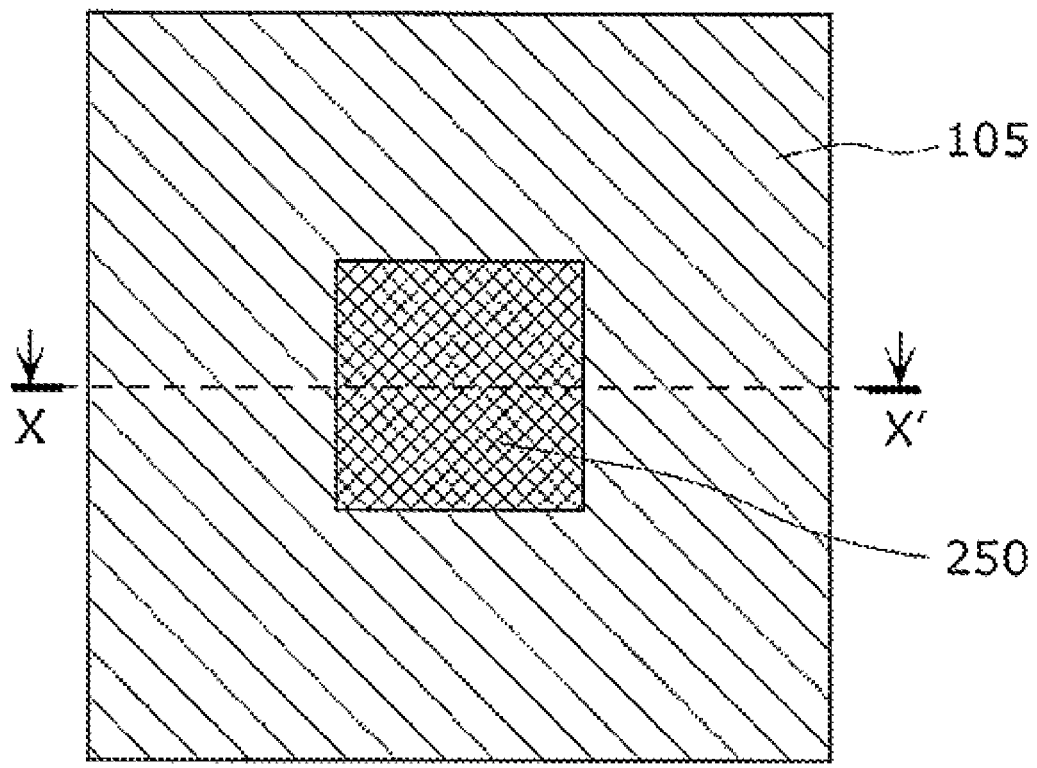
FIG. 5A is a top plane schematic view of a process of extending the top plane of an interlayer insulating film up to the top plane of the lower electrode, in a method of manufacturing the variable resistance element according to Embodiment 1 of the present invention.
Figure 5B:
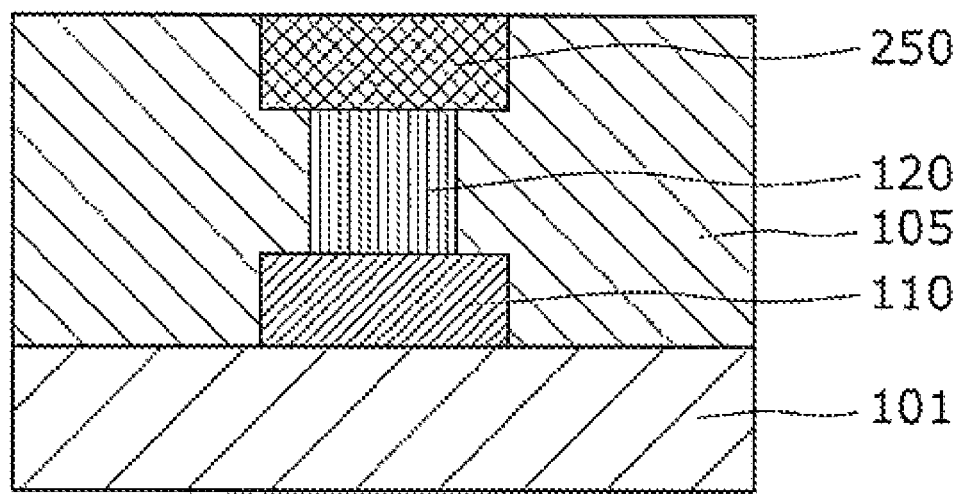
FIG. 5B is a schematic diagram showing a cross-section of FIG. 5A.

Next, as shown in FIGS. 5A and 5B, the height of the interlayer insulating film 105 is extended up to the top plane of the lower electrode 250. This can be formed in the manner described below. Specifically, the interlayer insulating film 105 is extended towards the higher layer by depositing an interlayer insulating film comprising TEOS—SiO on the structure shown in FIGS. 4A and 4B, using for example the CVD method, and making the surface of the film approximately flat by performing for example CMP. Subsequently, etching is performed on the surface of the interlayer insulating film 105, and the height of the surface of the interlayer insulating film 105 is lowered to the height of the lower electrode 250. At this time, although the height of the surface of the interlayer insulating film 105 and the top plane of the lower electrode 250 are shown as being the same in FIG. 5B, a perfect match is not necessary and it is sufficient that the top plane of the lower electrode 250 be exposed from the interlayer insulating film 105.

An argon (Ar) milling method or a dry-etching method is used in the etching at this time. In the present embodiment, a dry-etching method using a chlorine gas is used.

Figure 6A:
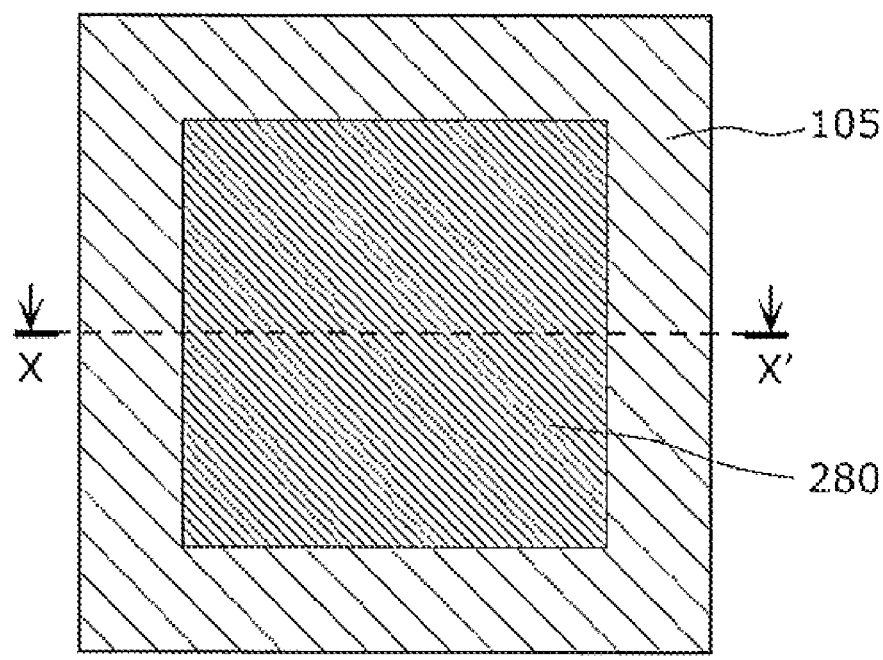
FIG. 6A is a top plane schematic view of processes up to the forming of an upper electrode, in the method of manufacturing the variable resistance element according to Embodiment 1 of the present invention.
Figure 6B:
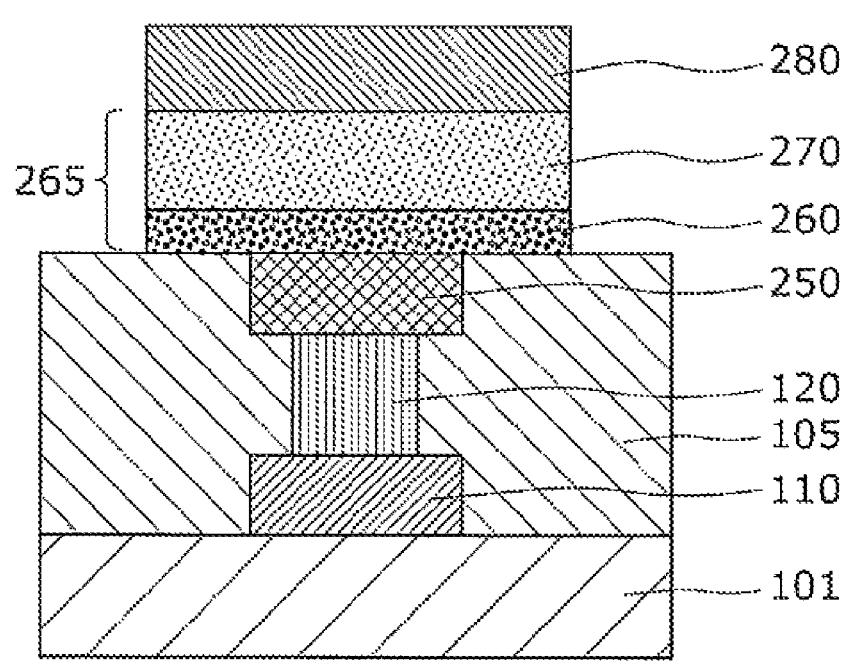
FIG. 6B is a schematic diagram showing a cross-section of FIG. 6A.

Next, as shown in FIGS. 6A and 6B, the high-concentration variable resistance layer 260 and the low-concentration variable resistance layer 270, which are of the oxygen-deficient type, and the upper electrode 280 are formed. The high-concentration variable resistance layer 260 and the low-concentration variable resistance layer 270 are oxides having low oxygen content, which is an atom number ratio, compared to an oxide having a stoichiometric composition. Here, the case where tantalum oxide is used shall be described. These can be formed in the manner below. As a preferred range for the low-concentration variable resistance layer 270, $TaO_x$ ($0 \leq x \leq 2.5$) and a thickness of between 30 nm and 100 nm, inclusive, are preferable. For the high-concentration variable resistance layer 260, $TaO_y$ ($x \leq y \leq 2.5$) and a thickness of between 1 nm and 8 nm, inclusive, are preferable. It should be noted that the chemical formula value of x for $TaO_x$ can be adjusted by adjusting the ratio of oxygen gas flow to the argon gas flow at the time of sputtering.

To carry out description following the specific process at the time of sputtering, a substrate is initially placed in a sputtering apparatus, and the inside of the sputtering apparatus is vacuumed up to approximately $7 \times 10^{-4}$ Pa. Sputtering is performed above the structure shown in FIGS. 5A and 5B, with tungsten as a target, power set to 250 W, a total gas pressure of the Ar gas and the oxygen gas set to 3.3 Pa, and a preset temperature of the substrate set to 30° C. When the oxygen partial pressure ratio is changed from 1% to 7%, the oxygen content of the tantalum oxide layer (that is, the composition ratio of oxygen atoms to tantalum atoms) changes from approximately 40% ($TaO_{0.66}$) to approximately 70% ($TaO_{2.3}$). The composition of the tantalum oxide layer can be measured using Rutherford Backscattering Spectrometry. Furthermore, here, an oxide having stoichiometric composition refers to, in the case of tantalum oxide, $Ta_2O_5$ which is an insulator, and by adopting the oxygen-deficient type, a metal oxide becomes conductive.

Subsequently, the upper electrode 280, the low-concentration variable resistance layer 270, and the high-concentration variable resistance layer 260 which have predetermined dimensions are formed by masking using the exposure process and then etching. Here, the planar view dimensions of the upper electrode 280, the low-concentration variable resistance layer 270, and the high-concentration variable resistance layer 260 need to be made larger than those of the lower electrode 250, and the larger these dimensions are, the more the advantageous effects of the present invention can be obtained.

Although the variable resistance film 265 is formed here as a stacked layer of the low-concentration variable resistance layer 270 which is a variable resistance film having a low oxygen concentration and the high-concentration variable resistance layer 260 which is a variable resistance film having a high oxygen concentration, the interface does not necessarily have to be structured to clearly divide between the two layers of the low-concentration variable resistance layer and the high-concentration variable resistance layer, and the same advantageous effect can be obtained even with a continuously changing distribution. A variable resistance film having such an oxygen distribution can be formed by forming a tantalum oxide film while changing the ratio of oxygen ($O_2$) and argon (Ar) (while reducing the oxygen ion ratio), using the reactive sputtering method of forming a tantalum oxide film by sputtering oxygen ($O_2$) ions and argon (Ar) ions onto a tantalum (Ta) target.

Furthermore, aside from the oxygen-deficient tantalum oxide film, an oxide film including similarly oxygen-deficient iron or at least one type of transitional metal oxide selected from titanium oxide, vanadium oxide, cobalt oxide, nickel oxide, zinc oxide, a niobium oxide film, a hafnium oxide film, and so on, which are transitional metal oxides, may be used for the variable resistance film 265, and the sputtering method, the CVD method, and so on may be used as the film-forming method.

Although the same material as that for the lower electrode 250 can be used for the upper electrode 280, a metal including at least one type selected from among copper (Cu), titanium (Ti), tungsten (W), tantalum (Ta), and tantalum nitride, may be used as an electrode that facilitates maintaining the resistance of the interface at the upper electrode 280-side of the variable resistance film 265 at a low resistance, that is, as an electrode that does not easily allow resistance change. Furthermore, the sputtering method, the CVD method, and so on, is used as the film-forming method for these materials.

It should be noted that although a square is illustrated as the shape of the lower electrode 250, the variable resistance film 265, and upper electrode 280 in the planar view in the present embodiment, the shape is not limited to such, and the same advantageous effect can be obtained even when shapes such as a rectangle, an ellipse, a circle, and a polygon. This is true also for the descriptions from Embodiment 2 onward to be described later.

Next, actual measurement data indicating results for the variable resistance element in the present invention shall be described.

Figure 8:
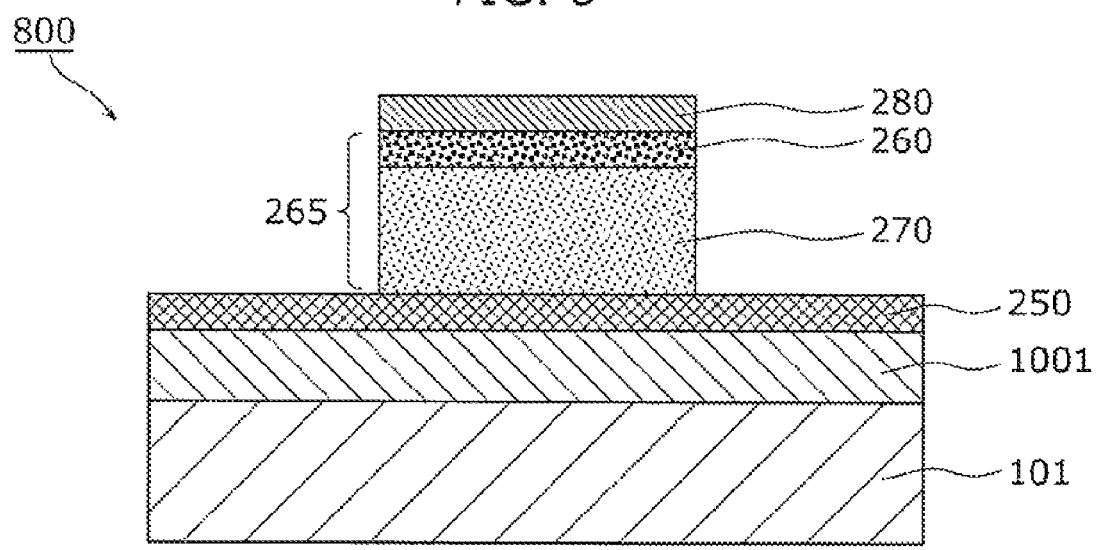
FIG. 8 is a schematic view of the variable resistance element for describing the advantageous effects of the variable resistance element in the present invention.

FIG. 8 shows a structure of a variable resistance element 800 that was studied by the inventors. Unlike the present invention, in this structure, the junction surface area between the upper electrode and the variable resistance film and the junction surface area between the lower electrode and the variable resistance film match each other. The variable resistance element 800 shown in FIG. 8 includes the substrate 101, an oxide layer 1001 formed above the substrate 101, the lower electrode 250 formed on the oxide layer 1001, the upper electrode 280, and the variable resistance layer 265 disposed between the lower electrode 250 and the upper electrode 280. Here, variable resistance film 265 includes the low-concentration variable resistance layer 270 having a low oxygen content and the high-concentration variable resistance layer 260 formed on the low-concentration variable resistance layer 270 and having a higher oxygen content than the low-concentration variable resistance layer 270.

Here, the metal oxide which is the material used for the variable resistance film 265 commonly has characteristics such that resistance becomes higher as the oxygen concentration increases. As such, the resistance of the variable resistance film 265 at the upper electrode 280-side immediately after manufacturing is high compared to that at the lower electrode 250-side.

Here, the electrode-side (here, the upper electrode 280-side) where the high-concentration variable resistance layer 260 is formed has a relatively high potential, and applying voltage equal to or greater than a threshold voltage for changing to high resistance is defined as applying an HR voltage (high resistance-changing voltage). Furthermore, the electrode-side where the low-concentration variable resistance layer is formed has a relatively low potential, and applying voltage equal to or greater than a threshold voltage for changing to low resistance is defined as applying an LR voltage (low resistance-changing voltage).

As a result of the inventors actually manufacturing and studying the variable resistance element 800 having the structure in FIG. 8, it was confirmed that the resistance value of the variable resistance element 800 tended to become low when the LR voltage (a voltage which is a condition for the upper electrode 280 to become relatively negative with respect to the lower electrode 250) is applied, and the resistance value of the variable resistance element 800 tended to become high when the HR voltage (a voltage which is a condition for the upper electrode 280 to become relatively positive with respect to the lower electrode 250) is applied.

Furthermore, although the structure in FIG. 8 has a configuration in which the high-concentration variable resistance layer 260 is manufactured so as to be in contact only with the upper electrode 280, it was confirmed that, even in a configuration in which the high-concentration variable resistance layer is manufactured so as to be in contact only with the lower electrode, the resistance value of the variable resistance element tended to become low when the LR voltage (a voltage which is a condition for the lower electrode-side to become relatively negative with respect to the upper electrode) is applied, and the resistance value of the variable resistance element tended to become high when the HR voltage (a voltage which is a condition for the lower electrode-side to become relatively positive with respect to the upper electrode) is applied.

In particular, it was confirmed that, when voltage is applied under a condition where |HR voltage|≧|LR voltage|, the change to high resistance according to the application of the HR voltage and the change to low resistance according to the application of the LR voltage occurred stably.

Although the mechanism by which the resistance of the variable resistance film changes according to the application of voltage is yet to be fully defined, it is considered that the resistance change phenomenon is manifested due to the gathering and dispersion of oxygen atoms, in the vicinity of the interface between an electrode and the variable resistance film, due to the interface. Specifically, when a positive voltage is applied to the electrode, negatively-charged oxygen atoms gather in the vicinity of the electrode, a high-resistance layer is formed, and the resistance changes to the high resistance.

Inversely, it is considered that, when a negative voltage is applied, the oxygen atoms disperse within the variable resistance layer and the resistance goes down.

In view of the aforementioned mechanism, the reason why resistance tends to change to high resistance with the application of the HR voltage and why resistance tends to change to low resistance with the application of the LR voltage is because the resistance change phenomenon in the electrode-side where the high-concentration variable resistance layer is formed becomes dominant because voltage tends to be applied mainly to the high-concentration variable resistance layer. Specifically, it is considered that, when a relatively positive voltage is applied to an electrode at the side where a high-concentration variable resistance layer is formed, the resistance changes to high resistance because a large voltage is applied to the high-concentration variable resistance layer, oxygen is injected into the high-concentration variable resistance layer, and the oxygen content increases even further.

A nonvolatile semiconductor memory device records and reproduces information by associating the high state of the resistance value of the variable resistance element to "1" in a memory cell and associating the low state to "0" in the memory cell, and the appropriate changing of the resistance value of the variable resistance element according to the application of the LR voltage or the HR voltage is important for the memory cell of the nonvolatile semiconductor memory device. In other words, when the resistance change operation can be performed only at the electrode-side where the high-concentration variable resistance layer is formed, mis-writing is reduced.

However, there are rare cases where a phenomenon occurs in which the resistance value of the variable resistance element does not decrease and high resistance is maintained even when the LR voltage is applied. This becomes noticeable particularly when |LR voltage| is increased. As a cause for the change to high resistance according to the application of the LR voltage, it is possible that this occurs because the resistance change phenomenon occurs dominantly at the electrode-side at which resistance change does not normally occur, that is, at the electrode-side opposite to the electrode-side where the high-concentration variable resistance layer is formed. Since this phenomenon leads to mis-writing in the memory cell, it is necessary to prevent the occurrence of this phenomenon.

FIG. 9A to 9F show an example of the resistance change operation of the variable resistance element 800.

In the variable resistance element 800 used in the experiments, the variable resistance film 265 comprised a tantalum oxide film (low-concentration variable resistance layer 270: $TaO_{1.8}$, high-concentration variable resistance layer 260: $TaO_{2.4}$), the film-thickness of the low-concentration variable resistance layer 270 and the high-concentration variable resistance layer 260 was 50 nm and 3 nm, respectively, the upper electrode 280 and the lower electrode 250 comprised Ir, the film-thickness of the upper electrode 280 and the lower electrode 250 was 30 nm, and the dimensions of the junction of the upper electrode 280 and the lower electrode 250 with the variable resistance film 265 were set to 0.5 µm×0.5 µm in FIGS. 9A and 9D, 1.0 µm×1.0 µm in FIGS. 9B and 9E, and 2.0 µm×2.0 µm in FIGS. 9C and 9F.

It should be noted that the voltages denoted in FIG. 9A to 9F indicates a voltage applied to the upper electrode 280 with reference to the lower electrode 250. Furthermore, with regard to the condition for applying voltage, in FIG. 9A to 9C, voltage is applied under the condition that |HR voltage|>|LR voltage|, with the purpose of stably inducing the resistance change phenomenon in the vicinity of the electrode (upper electrode 280)-side where the high-concentration variable resistance layer 260 is formed. Specifically, |HR voltage| was set to 2.0 V and |LR voltage| was set to 1.5 V. Furthermore, in FIG. 9D to 9F, voltage is applied under a condition such that |LR voltage| becomes a large value, with the purpose of inducing the resistance change phenomenon at the electrode (lower electrode 250)-side that is opposite to the electrode (upper electrode 280)-side where the high-concentration variable resistance layer 260 is formed. Specifically, |HR voltage| was set to 1.5 V and |LR voltage| was set to 2.0 V.

Figure 9A:
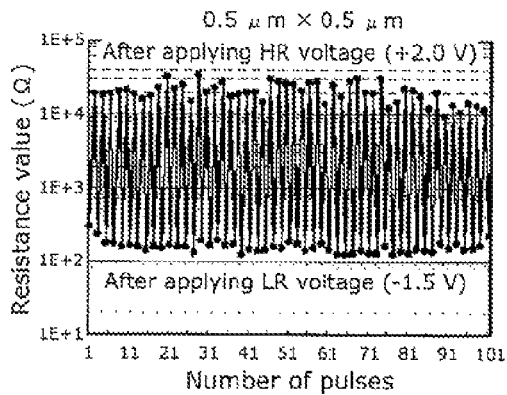
FIG. 9 shows actual measurement charts for describing the effects of the junction surface area between the lower electrode and a variable resistance film and the junction surface area between the upper electrode and the variable resistance film on the resistance change operation of the variable resistance element in the present invention.
Figure 9D:
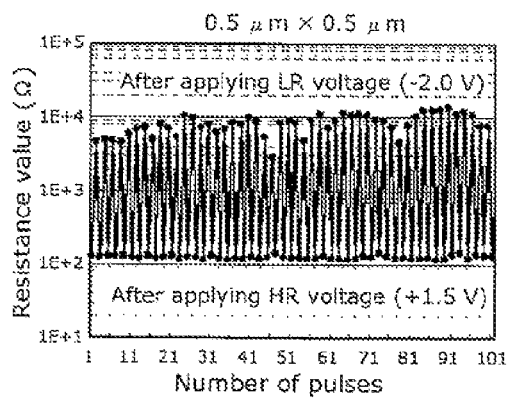
Figure 9B:
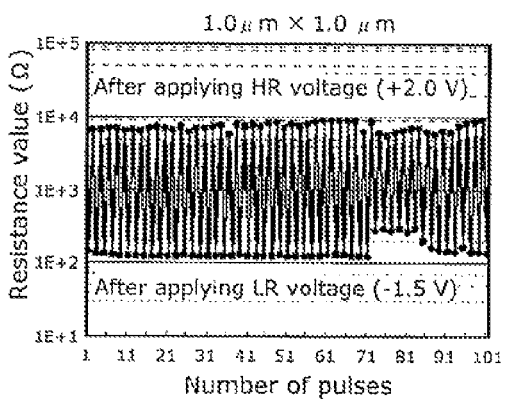
Figure 9E:
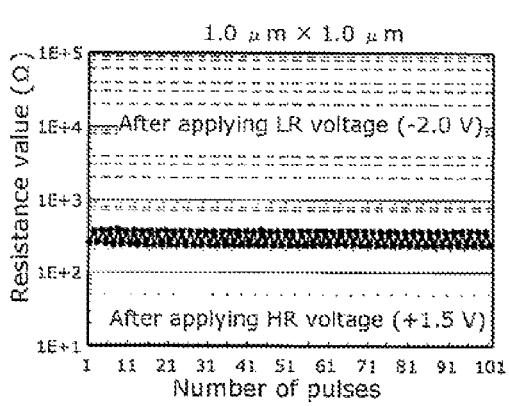
Figure 9C:
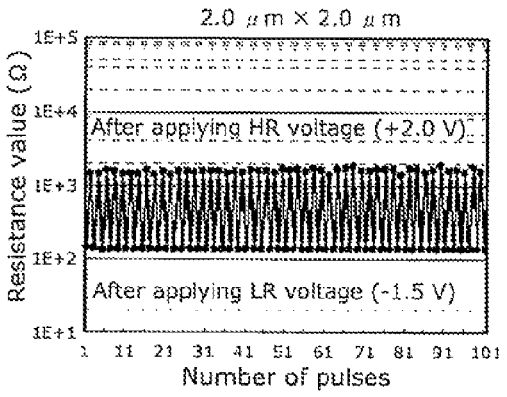

From the results in FIG. 9A to 9C, it was confirmed that change to low resistance occurs when the LR voltage is applied and change to high resistance occurs when the HR voltage is applied, and thus the resistance change operation of the variable resistance element 800 occurs in a stable manner.

Figure 9F:
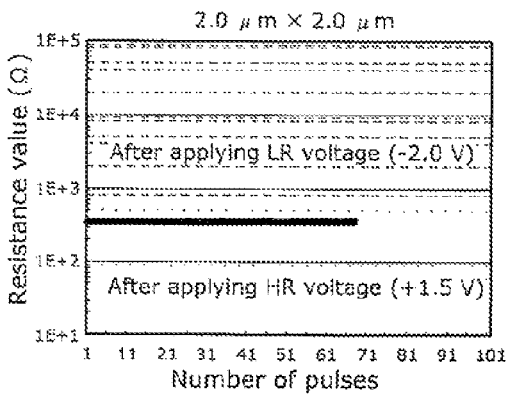

Furthermore, from the results in FIG. 9D to 9F, it was confirmed that change to high resistance occurs when the LR voltage is applied and change to low resistance occurs when the HR voltage is applied.

Inferring from the above-described mechanism, the electrode-side at which the resistance change phenomenon is thought to occur dominantly is the electrode (upper electrode 280)-side where the high-concentration variable resistance layer 260 is formed in FIG. 9A to 9C, and is the electrode (lower electrode 250)-side opposite the electrode (upper electrode 280)-side where the high-concentration variable resistance layer 260 is formed in FIG. 9D to 9F.

Here, it is seen that, in FIGS. 9B and 9C, the resistance change operation hardly changes (the range of the resistance change is reduced slightly) even when the respective junction surface areas between each of the upper electrode 280 and lower electrode 250 and the variable resistance film 265 increases. In contrast, it is seen that, in FIGS. 9E and 9F, the range of the resistance change decreases drastically as the junction surface areas increase. It can be said that the results in FIG. 9D to 9F show that the resistance change phenomenon at the electrode (lower electrode 250)-side that is opposite to the electrode-side (upper electrode 280)-side where the high-concentration variable resistance layer 260 is formed is suppressed.

Therefore, as can be seen from the results in FIG. 9D to 9F, it can be said that in order to suppress the resistance change phenomenon at the electrode (lower electrode 250)-side that is opposite to the electrode (upper electrode 280)-side where the high-concentration variable resistance layer 260 is formed, it is sufficient to increase the junction surface area between the variable resistance film (that is, the low-concentration variable resistance layer 270) and the electrode (that is, the lower electrode 250) at the electrode (lower electrode 250)-side opposite to the electrode (upper electrode 280-side)-side where the high-concentration variable resistance layer 260 is formed.

Furthermore, as can be seen from the experiment results shown in FIG. 9A to 9C, the resistance change phenomenon in the electrode (upper electrode 280)-side where the high-concentration variable resistance layer 260 is formed is suppressed, though only slightly, as the junction surface area increases. Therefore, in order to more reliably induce the resistance change phenomenon in the electrode (upper electrode 280)-side where the high-concentration variable resistance layer 260 is formed, it is preferable that the junction surface area between the high-concentration variable resistance layer 260 and the upper electrode 280 be reduced.

From the above description, it can be seen that the resistance change operation can be stabilized by increasing, by as much as possible, the junction surface area between the low-concentration variable resistance layer 270 and the lower electrode 250, and reducing, by as much as possible, the junction surface area between the high-concentration variable resistance layer 260 and the upper electrode 280.

The variable resistance element in the present invention was invented by applying such effect and, as shown in FIG. 1, by adopting a configuration in which the junction surface area between the side of the variable resistance film 265 where oxygen concentration is low (that is, the low-concentration variable resistance layer 270) and the electrode (the upper electrode 280) is made larger than the junction surface area between the side of the variable resistance film 265 where oxygen concentration is high (that is, the high-concentration variable resistance layer 260) and the electrode (the lower electrode 250), the resistance change operation of the variable resistance element 100 in response to the application of the LR voltage and the HR voltage can be stabilized.

Next, a nonvolatile semiconductor memory device 500 using the variable resistance element 100 according to the present embodiment shall be described using FIGS. 7A and 7B.

FIG. 7A is a schematic diagram showing the top plane of the nonvolatile semiconductor memory device 500 using the variable resistance element 100 according to the present embodiment, and FIG. 7B is a cross-sectional view of the cross-section along line X-X' in FIG. 7A as seen from the direction of the arrows.

As shown in FIGS. 7A and 7B, the nonvolatile semiconductor memory device 500 using the variable resistance element 100 according to the present embodiment includes: a substrate 102 on which plural transistors (Tr) are formed; the interlayer insulating film 105 formed covering the substrate 102; plural vias 121 each of which is formed within the interlayer insulating film 105 and electrically connected to a source/drain (source or drain) electrode 103 of a corresponding one of the transistors (Tr); plural lines 110 each of which is formed within the interlayer insulating film 105 and electrically connected to the top plane of a corresponding one of the vias 121; plural vias 120 each of which is formed within the interlayer insulating film 105 and electrically connected to the top plane of a corresponding one of the lines 110; and plural bottom electrodes each of which is formed within the interlayer insulating film 105 and electrically connected to the top plane of a corresponding one of the vias 120.

In addition, the nonvolatile semiconductor memory device 500 using the variable resistance element 100 according to the present embodiment includes: plural stacked layer-structures each formed within the interlayer insulating film 105 and including the high-concentration variable resistance layer 260, the low-concentration variable resistance layer 270, and the upper electrode 280 which are fabricated in the same shape in the planar view. The high-concentration variable resistance layer 260 is electrically connected, in the lower interface of the high-concentration variable resistance layer 260, to the top plane of at least two adjacent lower electrodes 250. In addition, the upper electrode 280 is electrically connected to a common plate line 113 by way of a via 122 formed within the interlayer insulating film 105. Furthermore, out of the electrodes 103 of the transistor, the electrode that is not connected to the high-concentration variable resistance layer, the via 121, and so on, is connected to a bit line 112. This bit line 112 is connected to a read circuit (not illustrated) configured of the transistor formed on the surface of the substrate 102. In addition, as shown in FIG. 7A, a word line 111 connected to a gate electrode 106 of the transistor (Tr), and the bit line 112 formed of the line 110 are arranged to be orthogonal to each other in the planar view.

Specifically, in the nonvolatile semiconductor memory device 500 shown in FIGS. 7A and 7B, when a pair of one variable resistance element 100 and one transistor (Tr) connected in series to such variable resistance element 100 make up a memory cell for 1 bit, a memory block including plural memory cells is formed. It should be noted that plural transistors (Tr) are separated by shallow trench isolations (STI) 104.

It should be noted that although all the lower electrodes 250 are connected to the same high-concentration variable resistance layer 260 in FIGS. 7A and 7B, the number of high-concentration variable resistance layers 260 within the nonvolatile semiconductor memory device 500 need not be one. It is sufficient that plural (two or more) lower electrodes 250 are connected to each of plural high-concentration variable resistance layers 260, and one memory block is formed by the plural variable resistance elements 100 including the lower electrodes 250 that are connected to the same high-concentration variable resistance layer 260 and by the plural transistors (Tr) connected to the lower electrodes 250 of such variable resistance elements 100. Specifically, in the nonvolatile semiconductor memory device according to the present invention, it is sufficient that the upper electrode 280 and the low-concentration variable resistance layer 270 of the plural variable resistance elements 100 included in a memory block be formed in common for the plural memory cells included such memory block.

By adopting such a configuration, the junction surface area between the upper electrode 280 and the low-concentration variable resistance layer 270 can be made sufficiently larger than the junction surface area between the lower electrode 250 and the high-concentration variable resistance layer 260, while making the dimensions of the lower electrode 250 and the intervals between the lower electrodes 250 as small as fabrication precision allows, and thus high integration as well as stabilization of the resistance change operation of the respective variable resistance elements 100 can be realized. In addition, localized fine fabrication on a memory cell basis becomes unnecessary in the patterning of the high-concentration variable resistance layer 260, the low-concentration variable resistance layer 270, and the upper electrode 280, and thus simplified patterning becomes possible due to the relaxation of patterning precision.

It should be noted that each of the lower electrodes 250 need to be connected to the source/drain electrode 103 of different transistors (Tr) formed on the substrate 102, and thus, in terms of circuit configuration, the lower electrodes 250 having smaller dimensions are formed on the side closer to the substrate than the upper electrode 280 which necessarily has larger dimensions. As such, in the variable resistance element 100 according to the present invention, the high-concentration variable resistance layer needs to be formed on the side close to the substrate.

It should be noted that although the nonvolatile semiconductor memory device 500 is described using the variable resistance element 100 shown in FIG. 1, the variable resistance elements according to Embodiments 2 to 4 described later may be used.

Embodiment 2

Next, a variable resistance element in Embodiment 2 of the present invention shall be described.

Figure 10:
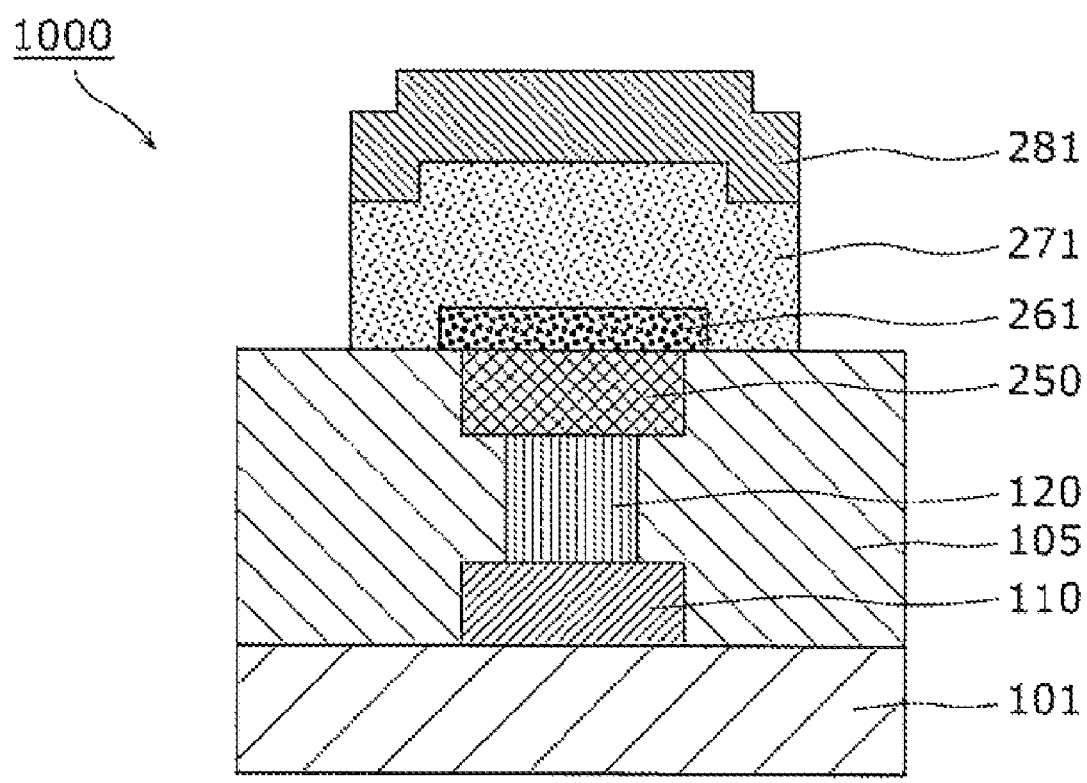
FIG. 10 is a schematic diagram showing an example of a cross-sectional configuration of a variable resistance element according to Embodiment 2 of the present invention.

FIG. 10 is a cross-sectional view of an example of a cross-sectional configuration of a variable resistance element 1000 according to Embodiment 2 of the present invention.

The difference between the variable resistance element 1000 according to the present embodiment and the variable resistance element 100 according to Embodiment 1 is that a high-concentration variable resistance layer 261 is formed only in the vicinity of the upper part of the lower electrode 250. Specifically, in the present embodiment, the high-concentration variable resistance layer 261 is patterned so as to completely cover one plane (here, the top plane) of the lower electrode 250, and a low-concentration variable resistance layer 271 covers (i) the end plane (here, the top plane) of the high-concentration variable resistance layer 261 that is opposite to the end plane (here, the bottom plane) of the high-concentration variable resistance layer 261 that is connected to the lower electrode 250, and (ii) the side planes of the high-concentration variable resistance layer 261.

Therefore, the manufacturing process up to the lower electrode 250 is the same as in Embodiment 1, and thus elements that are common to Embodiment 1 and Embodiment 2 are given the same name and description thereof shall not be repeated.

Next, a method of manufacturing the variable resistance element 1000 in the present embodiment shall be described using FIGS. 11A and 11B and FIGS. 12A and 12B. In each of the figures, A is a schematic diagram showing a top plane, and B is a cross-sectional view of the cross-section along line X-X' in A as seen from the direction of the arrows.

Figure 11A:
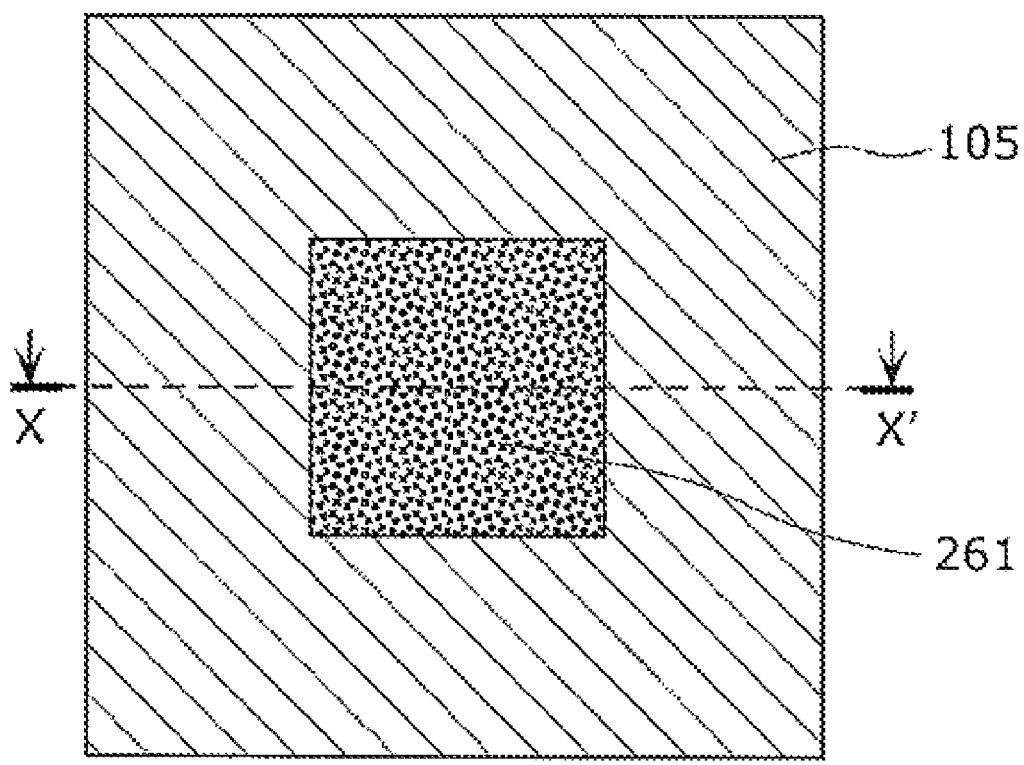
FIG. 11A is a top plane schematic view of a process of forming of a high-concentration variable resistance layer, in a method of manufacturing the variable resistance element according to Embodiment 2 of the present invention.
Figure 11B:
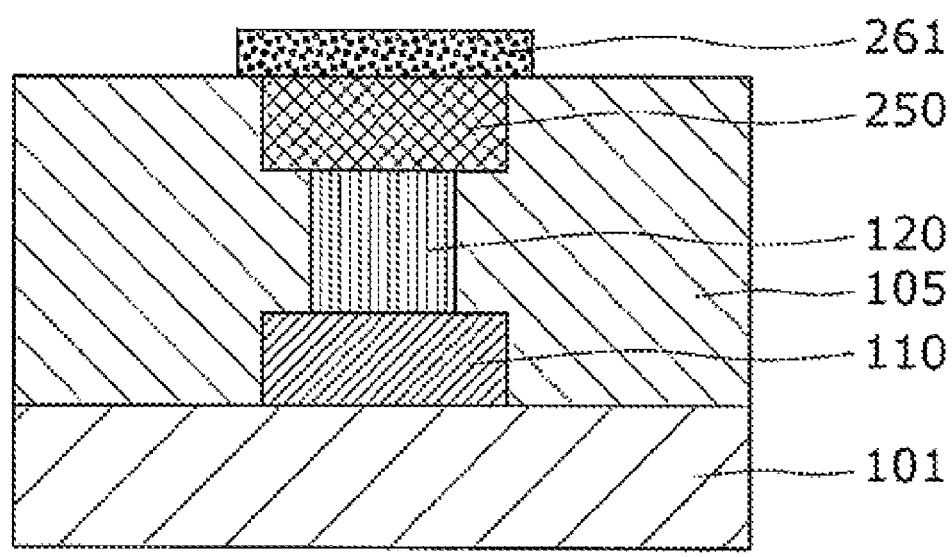
FIG. 11B is a schematic diagram showing a cross-section of FIG. 11A.

As shown in FIGS. 11A and 11B, the high-concentration variable resistance layer 261 is formed only in the vicinity of the upper portion of the lower electrode 250. Such forming is possible in the manner described below. The high-concentration variable resistance layer 261 of predetermined dimensions is formed by forming a 3 nm-thickness tantalum oxide film ($TaO_{2.4}$) having high oxygen concentration, on the structure shown in FIGS. 5A and 5B, using for example the sputtering method, and performing masking using the exposure process and then etching. It is preferable that the high-concentration variable resistance layer 261 completely cover the lower electrode 250 in the planar view, and thus the high-concentration variable resistance layer 261 needs to be made larger than the dimensions of the lower electrode 250 to take into consideration the alignment precision in fabrication. Here, the dimensions of the high-concentration variable resistance layer 261 are set to be 0.6 μm×0.6 μm.

Figure 12A:
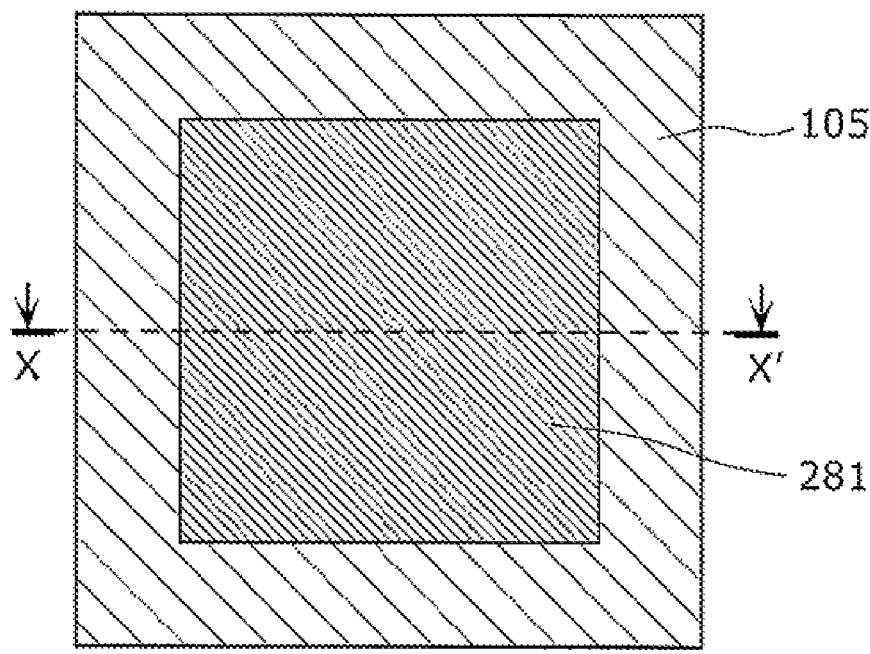
FIG. 12A is a top plane schematic view of processes up to the forming of an upper electrode, in the method of manufacturing the variable resistance element according to Embodiment 2 of the present invention.
Figure 12B:
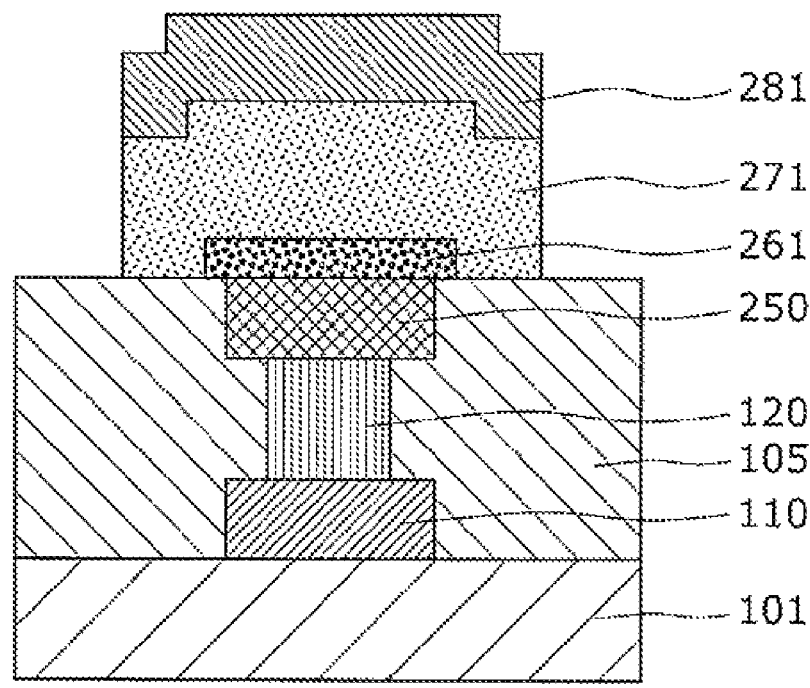
FIG. 12B is a schematic diagram showing a cross-section of FIG. 12A.

Next, as shown in FIGS. 12A and 12B, the low-concentration variable resistance layer 271 and an upper electrode 281 are formed. Such forming is possible in the manner described below. Specifically, a 50 nm-thickness tantalum oxide film ($TaO_{1.8}$) of the oxygen-deficient type is formed on the structure shown in FIGS. 11A and 11B, using for example the sputtering method, and a 50 nm Pt film is additionally formed on the tantalum oxide film by for example the sputtering method. Then, by masking using the photolithography process and then performing etching, the upper electrode 281 and the low-concentration variable resistance layer 271 which have predetermined dimensions are formed. Here, the planar view dimensions of the upper electrode 281 and the low-concentration variable resistance layer 271 need to be made larger than the dimensions of the high-concentration variable resistance layer 261, and the larger these dimensions are, the more the advantageous effects of the present invention can be obtained.

Although a method of using a tantalum oxide film ($TaO_{2.4}$) having high oxygen concentration as the high-concentration variable resistance layer 261 is described here, it does not necessarily have to be the tantalum oxide film ($TaO_{2.4}$), and an oxygen-deficient tantalum oxide film ($TaO_y$: y>x) with more oxygen than the oxygen-deficient tantalum oxide film ($TaO_x$) of the low-concentration variable resistance layer 271 is sufficient.

Furthermore, the same materials as in Embodiment 1 can be used for the upper electrode 281, the low-concentration variable resistance layer 271, and the high-concentration variable resistance layer 261.

Thus, by adopting a configuration in which the high-concentration variable resistance layer 261 is formed only in the vicinity of the upper portion of the lower electrode 250, and removing the rest of the high-concentration variable resistance layer 261, the advantageous effect described below can be obtained. Specifically, approximately 400° C. of heat is applied in the normal semiconductor element wiring process and oxygen disperses from the high-concentration variable resistance layer to the low-concentration variable resistance layer occurs due to this heat, thus increasing the oxygen concentration of the low-concentration variable resistance layer. However, as shown in the present embodiment, by removing the high-concentration variable resistance layer other than that which is in the vicinity of the upper portion of the lower electrode 250, oxygen dispersion from the portion that has been removed can be eliminated, and thus preventing that much of an increase in the oxygen concentration of the low-concentration variable resistance layer.

With this, it becomes possible to reduce the probability of the occurrence of change to high resistance (mis-writing) in the interface between the low-concentration variable resistance layer 271 and the upper electrode 281.

Embodiment 3

Next, a variable resistance element in Embodiment 3 of the present invention shall be described.

Figure 13:
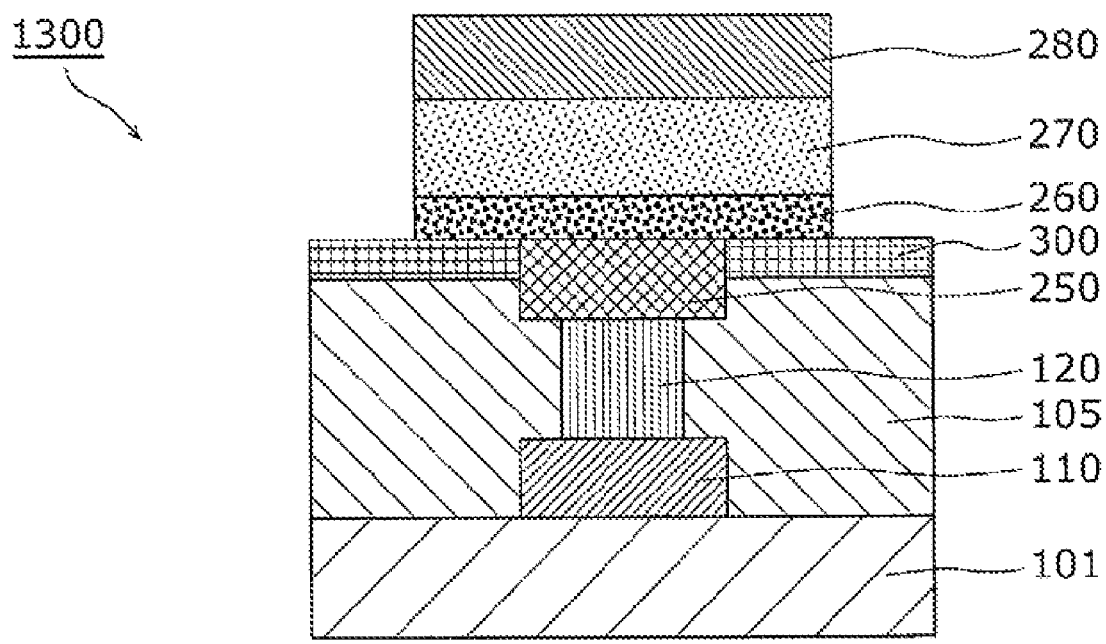
FIG. 13 is a schematic diagram showing an example of a cross-sectional configuration of a variable resistance element according to Embodiment 3 of the present invention.

FIG. 13 is a cross-sectional view of an example of a cross-sectional configuration of a variable resistance element 1300 according to Embodiment 3 of the present invention.

The difference between the variable resistance element 1300 according to the present embodiment and the variable resistance element 100 according to Embodiment 1 is that an oxygen barrier 300 is formed between the interlayer insulating film 105 and the high-concentration variable resistance layer 260. Specifically, in the present embodiment, out of the plane of the high-concentration variable resistance layer 260 which is in contact with the lower electrode 250, the region which is not in contact with the lower electrode 250 is covered by the oxygen barrier 300.

Therefore, the manufacturing process up to the via 120 is the same as in Embodiment 1, and thus elements that are common to Embodiment 1 and Embodiment 3 are given the same name and description thereof shall not be repeated.

Next, a method of manufacturing the variable resistance element 1300 in the present embodiment shall be described using FIGS. 14A and 14B to FIGS. 17A and 17B. In each of the figures, A is a schematic diagram of a top plane, and B is a cross-sectional view of the cross-section along line X-X' in A as seen from the direction of the arrows.

Figure 14A:
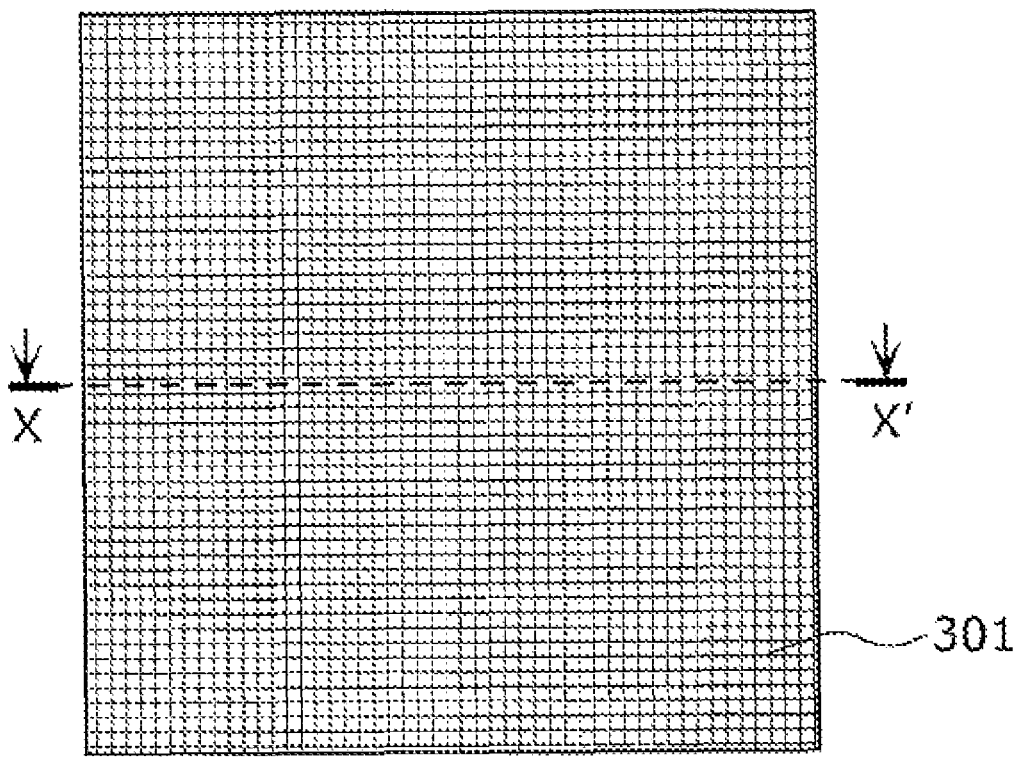
FIG. 14A is a top plane schematic view of processes up to the forming of an oxygen barrier film, in a method of manufacturing the variable resistance element according to Embodiment 3 of the present invention.
Figure 14B:
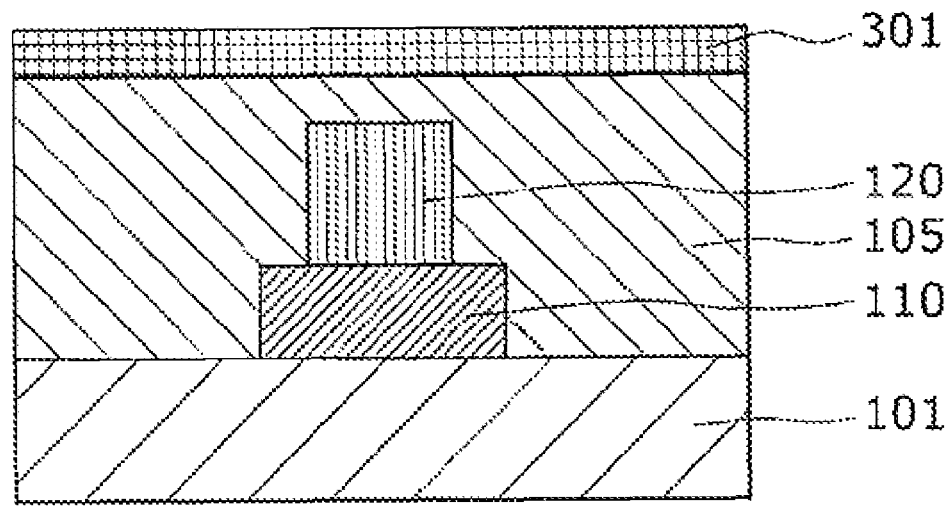
FIG. 14B is a schematic diagram showing a cross-section of FIG. 14A.

As shown in FIGS. 14A and 14B, the interlayer insulating film 105 is extended towards the higher layer by depositing, using for example the CVD method, a 10 nm-thickness interlayer insulating film comprising TEOS—SiO, on the substrate surface (FIGS. 3A and 3B) above which the via 120 is formed. In addition, a 20 nm-thick oxygen barrier film 301 comprising $Si_3N_4$ is deposited using for example the CVD method.

It should be noted that, aside from TEOS—SiO, a silicon nitride (SiN) film, a silicon carbonitride (SiCN) film which is a low-permittivity material, a silicon oxycarbide (SiOC) film, a fluorinated silicon oxide (SiOF) film, and so on may be used for the interlayer insulating film 105. In addition, a stacked structure of these materials may be used.

Figure 15A:
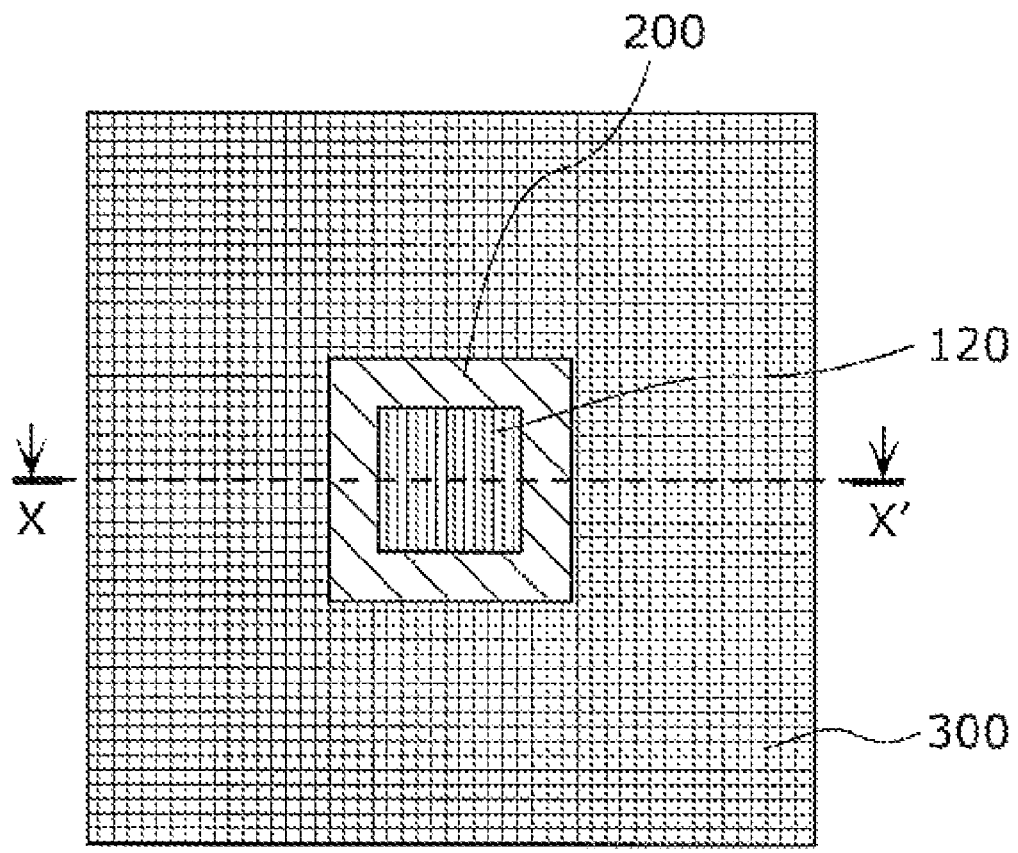
FIG. 15A is a top plane schematic view of a process of forming of a lower electrode trench, in a method of manufacturing the variable resistance element according to Embodiment 3 of the present invention.
Figure 15B:
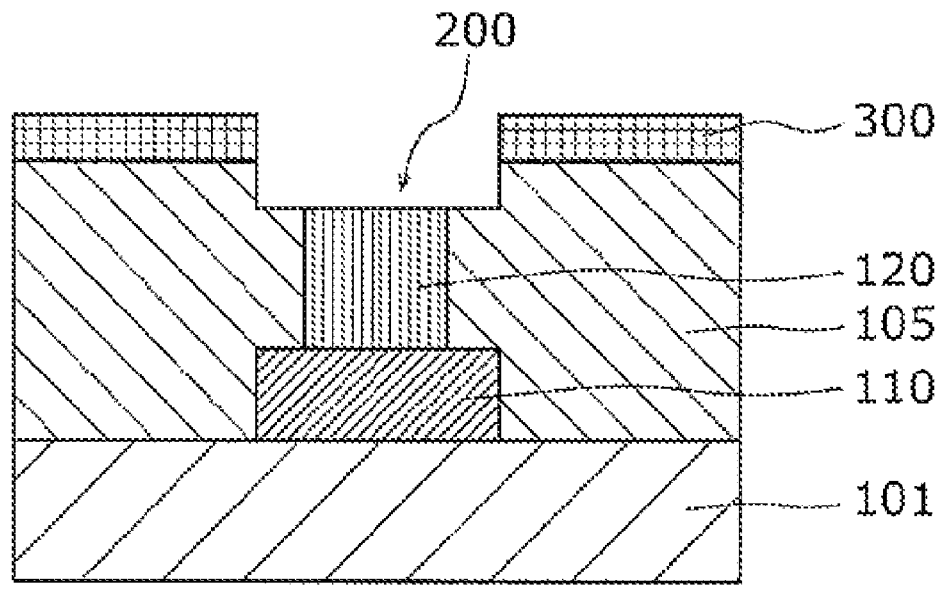
FIG. 15B is a schematic diagram showing a cross-section of FIG. 15A.

Next, as shown in FIGS. 15A and 15B, masking is performed using the exposure process and the portion that is not masked is etched using for example the dry-etching method to form a lower electrode trench 200 for forming an embedded lower electrode.

Although the bottom portion of the bottom electrode trench 200 is shown as being larger than the upper portion of the via 120 as well as being at the same height as the upper portion of the via 120 in FIG. 15B, such a relationship is not necessary, and it is sufficient that at least part of the lower portion of the lower electrode trench 200 and the upper portion of the via 120 overlap in the planar view. In addition, the height of the bottom portion of the lower electrode trench 200 may be lower than the upper portion of the via 120. Here, the bottom portion of the lower electrode trench measures 0.6 μm×0.6 μm, and has a depth of 30 nm.

Figure 16A:
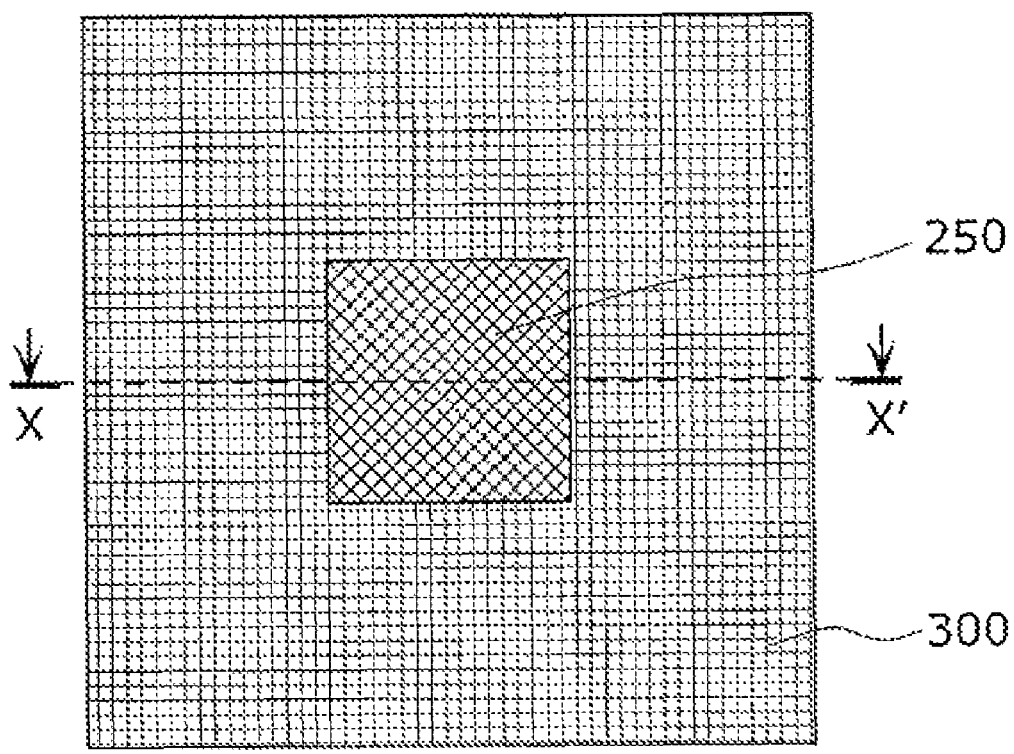
FIG. 16A is a top plane schematic view of a process of forming of a lower electrode, in a method of manufacturing the variable resistance element according to Embodiment 3 of the present invention.
Figure 16B:
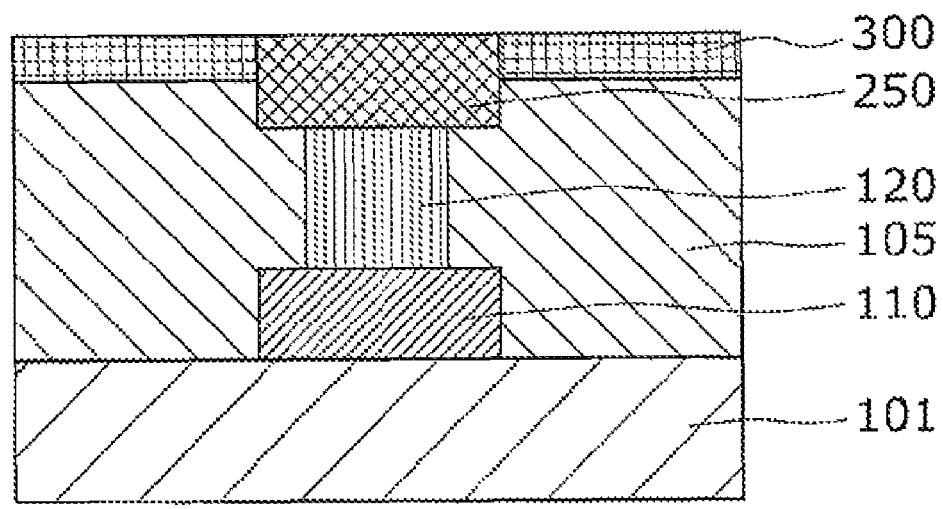
FIG. 16B is a schematic diagram showing a cross-section of FIG. 16A.

Next, as shown in FIGS. 16A and 16B, the lower electrode 250 is formed, and such forming is possible in the manner described below. 40 nm of platinum (Pt) is deposited on the surface of the lower electrode trench 200 shown in FIGS. 15A and 15B, using for example the sputtering method, and the surface of the Pt is planarized using CMP until the surface of the oxygen barrier 300 is exposed for example. It is preferable that a noble metal material such as platinum (Pt) or iridium (Ir), or a composite of these be used for the lower electrode 250. Furthermore, aside from the sputtering method, a plating method may be used as the deposition method.

Figure 17A:
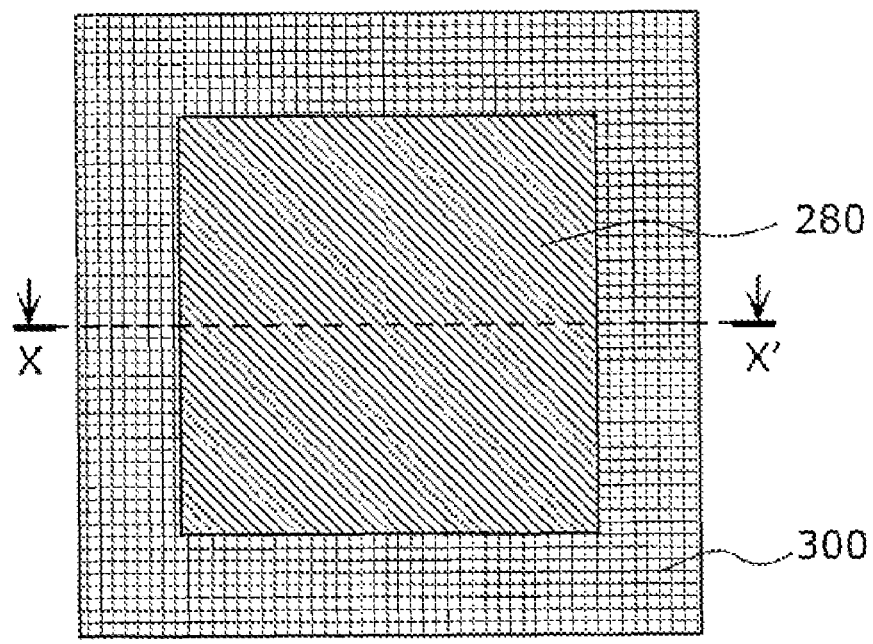
FIG. 17A is a top plane schematic view of processes up to the forming of an upper electrode, in the method of manufacturing the variable resistance element according to Embodiment 3 of the present invention.
Figure 17B:
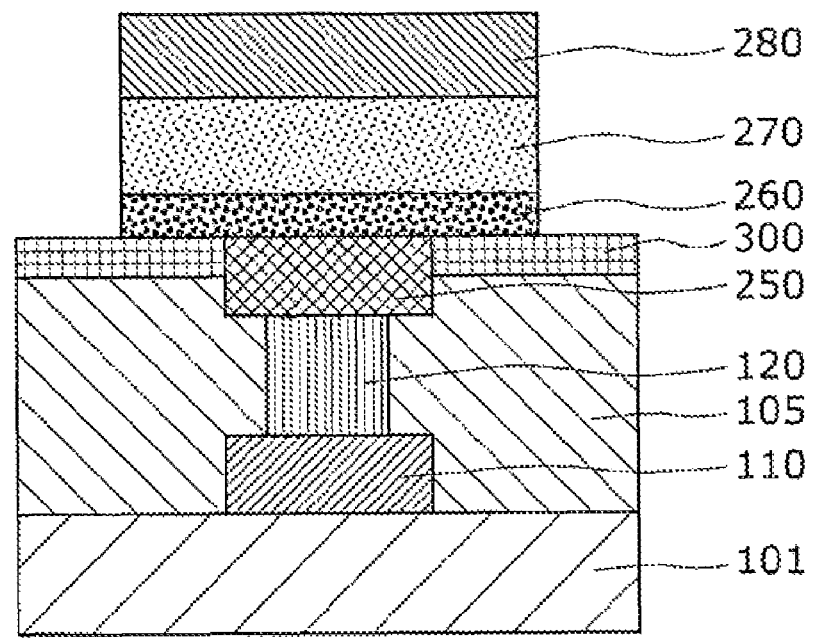
FIG. 17B is a schematic diagram showing a cross-section of FIG. 17A.

The subsequent processes are the same as the processes following FIGS. 6A and 6B shown in the manufacturing process in Embodiment 1, and the variable resistance element 1300 shown in FIGS. 17A and 17B can be formed by going through such processes.

In this manner, by forming the oxygen barrier 300 between the high-concentration variable resistance layer 260 and the interlayer insulating film 105, it is possible to prevent the dispersion of oxygen between the high-concentration variable resistance layer 260 and the interlayer insulating film 105 due to the heating during the manufacturing process, and thus fluctuation in the oxygen concentration of the high-concentration variable resistance layer 260 decreases. With this, the advantages of stabilizing the resistance change operation and expanding the options for the manufacturing method can be obtained.

Embodiment 4

Next, a variable resistance element in Embodiment 4 of the present invention shall be described.

Figure 18:
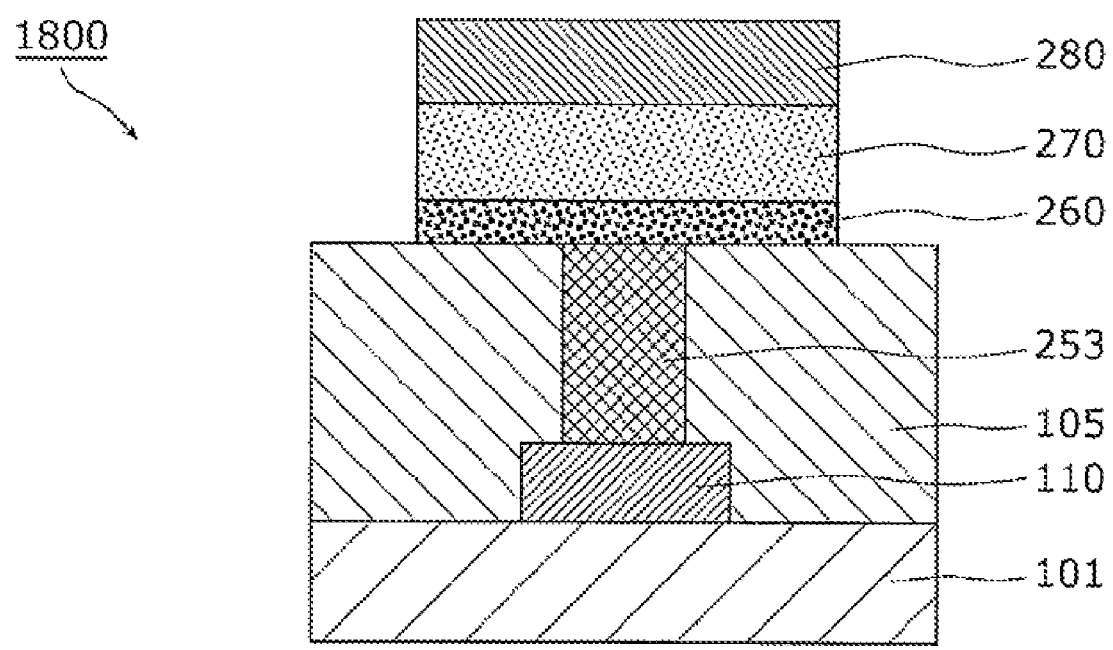
FIG. 18 is a schematic diagram showing an example of a cross-sectional configuration of a variable resistance element according to Embodiment 4 of the present invention.

FIG. 18 is a cross-sectional view of an example of a cross-sectional configuration of a variable resistance element 1800 according to Embodiment 4 of the present invention.

The difference between the variable resistance element 1800 according to the present embodiment and the variable resistance element 100 according to Embodiment 1 is that the via 120 and the lower electrode 250 which are formed so as to be embedded in the interlayer insulating film 105 in FIG. 1 are integrated to become a lower electrode 253 shown in FIG. 18. Specifically, in the present embodiment, the ehd plane (here, the bottom plane) of the lower electrode 253 that is opposite to the end plane (here, the top plane) of the lower electrode 253 that is connected to the high-concentration variable resistance layer 260 is connected to a plane (here, the top plane) of the line 110 formed on or under (here, under) the lower electrode 253. In addition, the lower electrode 253 is a via that fills a via hole provided in the interlayer insulating film 105 located between the high-concentration variable resistance layer 260 and the line 110, and electrically connects the high-concentration variable resistance layer 260 and the line 110.

The variable resistance element 1800 in the present embodiment can be manufactured (FIG. 18) by using the material used for the lower electrode, such as platinum (Pt) or iridium (Ir), as the material for filling the via 120 in the process of forming the via 120 in FIGS. 3A and 3B, and planarizing the surface thereof using, for example, CMP until the surface of the interlayer insulating film 105 is exposed, and then forming the high-concentration variable resistance layer 260, the low-concentration variable resistance layer 270, and the upper electrode 280 as shown in FIGS. 6A and 6B.

By adopting such a configuration, the advantageous effect of simplifying the manufacturing process can be obtained.

It should be noted that although in Embodiment 4, the via 120 and the lower electrode 250 which are formed so as to be embedded in the interlayer insulating film 105 in FIG. 1 are integrated to become a lower electrode 253 shown in FIG. 18, the via 120 and the lower electrode 250 can also be integrated in the same manner, in the structure in Embodiment 2 (FIG. 10) and the structure in Embodiment 3 (FIG. 13).

Furthermore, although Embodiment 3 shows an example in which the oxygen barrier 300 is formed between the interlayer insulating film 105 and the high-concentration variable resistance layer 260, aside from this, the oxygen barrier 300 between the interlayer insulating film 105 and the high-concentration variable resistance layer 260 can also be formed in the same manner in the structure in Embodiments 2 and 4 (FIG. 10 and FIG. 18, respectively).

Although the variable resistance element and the nonvolatile semiconductor memory device according to the present invention is described based on Embodiments 1 to 4, the present invention is not limited such embodiments. Embodiments resulting from various modifications of the exemplary embodiments as well as embodiments resulting from arbitrary combinations of constituent elements of the different exemplary embodiments that may be conceived by those skilled in the art are intended to be included within the scope of the present invention as long as these do not depart from the essence of the present invention.

For example, although the nonvolatile semiconductor memory device shown in FIGS. 7A and 7B has a structure in which a plurality of the variable resistance elements 100 in Embodiment 1 are provided, the nonvolatile semiconductor memory device according to the present invention is not limited to such a structure, and may have a structure in which a plurality of the variable resistance elements in Embodiments 2 to 4 are respectively provided, and may have a structure in which the respective variable resistance elements are turned upside-down (for example, a structure including, from the closest one from the substrate 101, an electrode, the low-concentration variable resistance layer 270, and the high-concentration variable resistance layer 260 which are common to the respective memory cells; and an electrode, the via 120, and the line 110 which are stacked thereon and provided independently for each of the memory cells).

Furthermore, although the bottom layer of the variable resistance film is the high-concentration variable resistance layer 260 and its top layer is the low-concentration variable resistance layer 270 in Embodiments 1 to 4, the present invention is not limited to such a structure, and the bottom layer of the variable resistance film may be the low-concentration variable resistance layer 270 and its top layer may be the high-concentration variable resistance layer 260. In other words, the variable resistance element according to the present invention is not restricted by the vertical positional relationship between the two layers as long as the condition in which the junction surface area between the low-concentration variable resistance layer and the electrode that is in contact with the low-concentration variable resistance layer is larger than the junction surface area between the high-concentration variable resistance layer and the electrode that is in contact with the high-concentration variable resistance layer is satisfied.

INDUSTRIAL APPLICABILITY

The variable resistance element and the nonvolatile semiconductor memory device using the same in the present invention have a high degree of integration, are capable of low-power and high-speed operation, and in addition have stable writing and reading characteristics, and are thus useful as a nonvolatile semiconductor memory element and a nonvolatile semiconductor memory device used in various electronic devices such as digital household appliances, memory cards, mobile phones, and personal computers.

REFERENCE SIGNS LIST 101, 102 Substrate
103 Source/drain electrode
104 STI
105 Interlayer insulating film
106 Gate electrode
110 Line
111 Word line
112 Bit line
113 Common plate line
120, 121, 122 Via
200 Lower electrode trench
250, 253 Lower electrode
260, 261 High-concentration variable resistance layer
265 Variable resistance film
270, 271 Low-concentration variable resistance layer
280, 281 Upper electrode
300 Oxygen barrier
301 Oxygen barrier film
500 Nonvolatile semiconductor memory device
100, 800, 1000, 1300, 1800 Variable resistance element
1001 Oxide layer
Tr (MOS) transistor

The invention claimed is:

1. Variable resistance element comprising:
a substrate; and
a multilayered structure formed above said substrate,
wherein said multilayered structure includes a first electrode, a second electrode, and a variable resistance film that is disposed between said first and second electrodes and changes between a high resistance state and a low resistance state according to a polarity of a voltage applied between said first and second electrodes,
said variable resistance film includes a low-concentration oxide layer which is in contact with said first electrode, and a high-concentration oxide layer which is in contact with said second electrode and induces resistance change,
an oxygen concentration of said low-concentration oxide layer is lower than an oxygen concentration of said high-concentration oxide layer, and
a junction surface area between said first electrode and said low-concentration oxide layer is larger than a junction surface area between said second electrode and said high-concentration oxide layer.

2. The variable resistance element according to claim 1,
wherein said high-concentration oxide layer is patterned to completely cover one plane of said second electrode, and
said low-concentration oxide layer covers an end plane and side planes of said high-concentration oxide layer, the end plane being located opposite to an end plane of said high-concentration oxide layer, which is connected to said second electrode.

3. The variable resistance element according to claim 1,
wherein, of a plane of said high-concentration oxide layer, which is in contact with said second electrode, a region that is not in contact with said second electrode is covered by an oxygen barrier.

4. The variable resistance element according to claim 1,
wherein, of said second electrode, an end plane that is opposite to an end plane which is in contact with said high-concentration oxide layer is connected to a line formed above or below said second electrode.

5. The variable resistance element according to claim 4,
wherein said second electrode is a via that fills a via hole provided in an interlayer insulating film located between said high-concentration oxide layer and said line, said second electrode electrically connecting said high-concentration oxide layer and said line.

6. The variable resistance element according to claim 1,
wherein said second electrode comprises platinum, iridium, or a composite of platinum and iridium.

7. The variable resistance element according to claim 6,
wherein said first electrode comprises at least any one selected from among copper, titanium, tungsten, tantalum, and tantalum nitride.

8. The variable resistance element according to claim 1,
wherein said high-concentration oxide layer and said low-concentration oxide layer are oxygen-deficient metal oxides which are oxides having a lower oxygen content compared to an oxide having a stoichiometric composition, the oxygen content being an atom number ratio, and
said metal oxide films comprise at least any one selected from among tantalum oxide, ferrioxide, titanium oxide, vanadium oxide, cobalt oxide, nickel oxide, zinc oxide, niobium oxide, and hafnium oxide.

9. A nonvolatile semiconductor memory device comprising a memory block including memory cells each of which includes said variable resistance element according to claim 1 and a transistor having a source or a drain connected to said variable resistance element,
wherein said first electrodes and said low-concentration oxide layers of said variable resistance elements included in said memory block are formed as a common first electrode and a common low-concentration oxide layer, respectively, for said memory cells included in said memory block.

10. The nonvolatile semiconductor memory device according to claim 9,
wherein said high-concentration oxide layers of said variable resistance elements included in said memory block are formed as a common layer for said memory cells included in said memory block.

* * * * *